(12) United States Patent
Naitoh et al.

(10) Patent No.: US 7,098,132 B2
(45) Date of Patent: Aug. 29, 2006

(54) METHOD OF MANUFACTURING FLEXIBLE WIRING BOARD

(75) Inventors: Keiichi Naitoh, Kanuma (JP); Toshihiro Shinohara, Kanuma (JP); Masahiro Watanabe, Kanuma (JP)

(73) Assignees: Sony Chemicals Corp., Tokyo (JP), part interest; Sony Corporation, Tokyo (JP), part interest ( * ) Notice: Subject to any disclaimer, the term of this patent is extended or adjusted under 35 U.S.C. 154(b) by 0 days.

(21) Appl. No.: 11/087,211

(22) Filed: Mar. 23, 2005

(65) Prior Publication Data

US 2005/0164492 A1    Jul. 28, 2005

Related U.S. Application Data

(60) Division of application No. 10/646,623, filed on Aug. 22, 2003, now Pat. No. 6,912,779, which is a continuation of application No. PCT/JP02/01349, filed on Feb. 18, 2002.

(30) Foreign Application Priority Data

Feb. 23, 2001    (JP)    ............................. 2001-048878

(51) Int. Cl.
    *H01L 21/44*    (2006.01)

(52) U.S. Cl. .................. 438/678; 427/97.9; 29/846; 29/852

(58) Field of Classification Search ........ 438/618–680; 29/846–860; 427/97.1–97.9
    See application file for complete search history.

(56) References Cited

U.S. PATENT DOCUMENTS 6,197,425 B1 *    3/2001    Sekimoto et al. ........... 428/416

* cited by examiner

*Primary Examiner*—H. Jey Tsai
(74) *Attorney, Agent, or Firm*—Osha Liang LLP

(57) ABSTRACT

In the present invention, a reference conductive layer and a first surface conductive layer are respectively provided on a surface and a back face of a first base film. The first base film includes a first via hole penetrating the first surface conductive layer. After a first electroless plating layer and a first conductive material are sequentially grown on a surface of the first base film, a first coating conductive layer composed of the first electroless plating layer, the first conductive material and the first surface conductive layer, is etched to have a reduced thickness. Then, the first coating conductive layer is patterned to form a first wiring layer. In this manner, a desired pattern width can be obtained even in the case where the first coating conductive layer is patterned by isotropic etching such as wet etching.

10 Claims, 33 Drawing Sheets

METHOD OF MANUFACTURING FLEXIBLE WIRING BOARD

CROSS-REFERENCE TO RELATED APPLICATIONS

This is a divisional application of U.S. patent application Ser. No. 10/646,623, filed on Aug. 22, 2003 now U.S. Pat. No. 6,912,779. The '623 Application is a Continuation of PCT/JP02/01349, filed on Feb. 18, 2002. The present application claims benefit under 35 U.S.C. § 120 of these applications and incorporates these prior applications by reference in their entireties.

BACKGROUND OF THE INVENTION

1. Field of the Invention

The present invention relates to a method of manufacturing a flexible wiring board, and in particular, to an improvement of a wiring layer included in a flexible wiring board frequently used for a multi-layered wiring board.

2. Description of the Related Art

Conventionally, a flexible wiring board having such a structure that a desired circuit pattern is formed on a surface of an insulating film is frequently used for various devices.

Since even a build-up of a plurality of such flexible wiring boards does not have a large thickness, the flexible wiring board is frequently used particularly for constituting a multi-layered wiring board by building up a plurality of wiring boards, each having a circuit pattern formed thereon.

A method of manufacturing such a multi-layered wiring board will be described below. FIGS. 66 to 75 are cross sectional views showing the steps of the manufacturing method.

First, a polyimide precursor is applied onto a surface of a metal foil such as a copper foil. The polyimide precursor is semi-cured to form a first base film made of polyimide. The first base film and the metal foil are bonded to each other in this state. Next, after a second metal foil is placed on the surface of the first base film, the second metal foil is heated while being pressed against the surface of the first base film to bond the first base film and the second metal film to each other. As a result, the first base film is sandwiched between two metal foils. Thereafter, a carrier film made of polyethylene terephthalate (PET) is provided onto the surface of one of the metal foils. This state is shown in FIG. 66. Reference numeral 111 in FIG. 66 denotes the first base film, and reference numerals 112 and 113 denote the metal foils, respectively. Reference numeral 114 denotes the carrier film.

Subsequently, the surface of the metal foil 113 is irradiated with laser light at a predetermined position for a plurality of times, wherein on the surface the carrier film 114 is not provided (hereinafter, referred to as a first surface-side conductive layer). As a result, the first surface-side conductive layer 113 and the first base film 111 are removed at the laser irradiated position so that a first via hole 115 is formed so as to penetrate the first surface-side conductive layer 113 and the first base film 111 to reach the metal foil 112 (hereinafter, referred to as a back-side conductive layer) on the side where the carrier film 114 is formed. This state is shown in FIG. 67.

Next, the first base film 111 including the first via hole 115 formed therethrough is immersed into an electroless plating solution (not shown) to grow an electroless plating layer 118 made of copper from the surface of the back-side conductive layer 112 over the surfaces of the first base film 111 which is exposed on the inner side face of the first via hole 115 and the first surface-side conductive layer 113. This state is shown in FIG. 68.

Subsequently, after the first base film 111 is immersed into an electrolytic plating solution containing copper (not shown), a DC voltage is applied between the electrolytic plating solution and the back-side conductive layer 112. As a result, a conductive material made of copper is grown on a surface of the electroless plating layer 118. Since the electroless plating layer 118 is provided over the entire surface of the first base film 111, the grown conductive material fills the first via hole 115 while covering the entire surface of the first base film 111. When the first via hole 115 is completely filled with the conductive material so that the surface of the conductive material becomes flat, the growth of the conductive material is terminated. Subsequently, a resist is applied onto the surface of the conductive material and is then patterned to form a resist film 190. This state is shown in FIG. 69, where reference numerals 116 and 190 denote the conductive material and the resist film, respectively.

Next, the conductive material 116, the electroless plating layer 118, and the first surface-side conductive layer 113 are etched by isotropic etching such as wet etching using the resist film 190 as a mask so as to pattern these layers into a desired pattern. As a result, a first surface wiring layer composed of the conductive material 116, the electroless plating layer 118 and the first surface-side conductive layer 113 is formed. This state is shown in FIG. 70, where reference numeral 120 denotes the first surface wiring layer.

At this moment, the conductive material 116 is grown to such a degree that the conductive material 116 fills the first via hole 115 to provide a flat surface thereof. Therefore, the conductive material 116 has a considerably large thickness. When the conductive material 116 having such a considerably large thickness is etched by isotropic etching such as wet etching to form the first surface wiring layer, there arises a problem in that a pattern width $\Delta w_1$ of the actually formed first surface wiring layer 120 becomes smaller than a pattern width $\Delta w_0$ of the resist film 190, that is, a desired pattern width, as shown in FIG. 70.

Next, after the resist film 190 is stripped off, a polyimide precursor solution is applied onto the surfaces of the first surface wiring layer 120 and the first surface-side conductive layer 113. Then, the polyimide precursor solution is semi-cured to form a second base film made of polyimide. This state is shown in FIG. 71, where reference numeral 151 denotes the second base film. The second base film 151, and the first surface wiring layer 120 and the first surface-side conductive layer 113 are bonded to each other in this state.

Next, after a third metal foil is placed on a surface of the second base film 151, the third metal foil is heated while being pressed against the surface of the second base film 151 to bond the second base film 151 and the third metal foil (hereinafter, referred to as a second surface-side conductive layer) to each other. Thereafter, the surface of the second surface-side conductive layer is irradiated with laser light for a plurality of times. As a result, a second via hole is formed at the laser irradiated position so as to penetrate the second surface-side conductive layer and the second base film 151 to reach the first surface-side wiring layer 120. This state is shown in FIG. 72, where reference numerals 153 and 155 denote the second surface-side conductive layer and the second via hole, respectively.

Subsequently, the first base film 111 is immersed into an electroless plating solution (not shown). Then, an electroless plating layer 158 made of copper is grown from the surface of the second surface-side conductive layer 153 over the surfaces of the second base film 151 which is exposed on the inner side face of the second via hole 155, and the first surface wiring layer 120. The state after the growth of the electroless plating layer 158 is shown in FIG. 73.

Thereafter, as shown in FIG. 74, a conductive material 156 made of copper is grown on the entire surface of the electroless plating layer 158 by electrolytic plating. After the conductive material 156 is grown to such a degree that the conductive material 156 fills the second via hole 155 to provide a flat surface. Then, a second surface-side wiring layer 170 composed of the conductive material 156, the electroless plating layer 158, and the second surface conductive layer 153 is formed by patterning as shown in FIG. 75. Thereafter, the metal foil 112 on the back side is patterned to form a wiring layer 121 on the back side, thereby completing a double-layered flexible wiring board 101.

As described above, however, the conductive materials 116, 156 and the like, each having a considerably large thickness, are patterned by isotropic etching such as wet etching to form the first and second surface wiring layers 120 and 170. As a result, there arises a problem that a pattern width of each of the surface wiring layers 120 and 170 becomes smaller than a desired pattern width.

Moreover, an increased thickness of each of the surface wiring layers 120 and 170 also disadvantageously increases a thickness and weight of the flexible wiring board 101. Since these problems appear in a more notable manner with increase in the number of layers constituted by the flexible wiring board, such problems present major obstacles to increase in the number of layers.

SUMMARY OF THE INVENTION

According to one aspect of the present invention, in a method of manufacturing a flexible wiring board including, a substrate including a reference conductive layer, a first base film provided on said reference conductive layer, and a first surface conductive layer provided on said first base film, the method comprising the steps of forming a first hole penetrating said first surface conductive layer and said first base film so that said reference conductive layer is exposed on its bottom and said first base film is exposed on its inner peripheral side face, depositing a first electroless plating layer by electroless plating at least on a surface of said first base film exposed on inner peripheral side face of said first hole, growing a first electrolytic plating layer by electrolytic plating on a surface of said first electroless plating layer so as to fill said first hole with said first electrolytic plating layer and removing said first electrolytic plating layer and said first electroless plating layer provided on said first surface conductive layer so as to expose said first surface conductive layer.

In one aspect of a method of manufacturing a flexible wiring board according to the present invention, the method includes said first surface conductive layer is a metal foil and adhered to said first base film.

In one aspect of a method of manufacturing a flexible wiring board according to the present invention, the method includes said reference conductive layer is brought into contact with an electrode when said electrolytic plating is conducted.

Furthermore, in one aspect of a method of manufacturing a flexible wiring board according to the present invention, the method further includes the steps of depositing an auxiliary electrolytic plating layer by electrolytic plating on a surface of said reference conductive layer, exposed on the bottom of said first hole, prior to said step of depositing said first electroless plating layer.

In one aspect of a method of manufacturing a flexible wiring board according to the present invention, the method includes growth of said auxiliary electrolytic plating layer is terminated before the auxiliary electrolytic plating layer reaches said first surface conductive layer.

Furthermore, in one aspect of a method of manufacturing a flexible wiring board according to the present invention, the method further includes the steps of patterning said first surface conductive layer after said step of exposing the first surface conductive layer.

Furthermore, in one aspect of a method of manufacturing a flexible wiring board according to the present invention, the method further includes the steps of providing a second base film and a second surface conductive layer on said patterned first surface conductive layer, forming a second hole penetrating said second surface conductive layer and said second base film so that said first surface conductive layer is exposed on its bottom and said second base film is exposed on its inner peripheral side face, depositing a second electroless plating layer by electroless plating at least on a surface of said second base film exposed on inner peripheral side face of said second hole and growing a second electrolytic plating layer by electrolytic plating on a surface of said second electroless plating layer so as to fill said second hole with said second electrolytic plating layer.

In one aspect of a method of manufacturing a flexible wiring board according to the present invention, the method includes said second surface conductive layer is a metal foil and adhered onto said second base film.

Furthermore, in one aspect of a method of manufacturing a flexible wiring board according to the present invention, the method further includes the steps of patterning said second surface conductive layer.

Furthermore, in one aspect of a method of manufacturing a flexible wiring board according to the present invention, the method further includes the steps of providing a third base film and a third surface conductive layer on the surface of said reference conductive layer, opposite to the side where said first base film is provided, forming a third hole penetrating said third surface conductive layer and said third base film so that said reference conductive layer is exposed on its bottom and said third base film is exposed on its inner peripheral side face, depositing a third electroless plating layer by electroless plating at least on a surface of said third base film, exposed on inner peripheral side face of said third hole, growing a third electrolytic plating layer by electrolytic plating on a surface of said third electroless plating layer so as to fill said third hole with said third electrolytic plating layer and removing said third electrolytic plating layer and said third electroless plating layer provided on said third surface conductive layer so as to expose said third surface conductive layer.

Furthermore, in one aspect of a method of manufacturing a flexible wiring board according to the present invention, the method further includes the steps of patterning said third surface conductive layer.

According to one aspect of the present invention, in a method of manufacturing a flexible wiring board including, a substrate including a reference conductive layer, a first base film provided on said reference conductive layer and a first surface conductive layer provided on said first base film, the method comprising the steps of forming a first hole penetrating said first surface conductive layer and said first base film so that said reference conductive layer is exposed on its bottom and said first base film is exposed on its inner peripheral side face, depositing a first electroless plating layer by electroless plating at least on a surface of said first base film exposed on inner peripheral side face of said first hole, growing a first electrolytic plating layer by electrolytic plating on a surface of said first electroless plating layer so as to fill said first hole with said first electrolytic plating layer and then providing said electroless plating layer and said electrolytic plating layer on said first surface conductive layer to form a first surface coating layer, etching said first electrolytic plating layer to reduce a thickness thereof so as to reduce a thickness of said first surface coating layer on said first base film and forming a patterned resist film on a surface of said first surface coating layer having a reduced thickness and then removing said first surface coating layer situated on a bottom of an opening of said resist film so as to pattern said first surface coating layer.

In one aspect of a method of manufacturing a flexible wiring board according to the present invention, said first surface conductive layer is a metal foil and is adhered to said first base film.

In one aspect of a method of manufacturing a flexible wiring board according to the present invention, said reference conductive layer is brought into contact with an electrode when said electrolytic plating is conducted.

In one aspect of a method of manufacturing a flexible wiring board according to the present invention, the method further includes the step of depositing an auxiliary electrolytic plating layer by electrolytic plating on a surface of said reference conductive layer, exposed on the bottom of said first hole, prior to said step of depositing the first electroless plating layer.

In one aspect of a method of manufacturing a flexible wiring board according to the present invention, growth of said auxiliary electrolytic plating layer is terminated before said auxiliary electrolytic plating layer reaches said first surface conductive layer.

In one aspect of a method of manufacturing a flexible wiring board according to the present invention, the method further includes the step of providing a second base film and a second surface conductive layer on said patterned first surface coating layer, forming a second hole penetrating said second surface conductive layer and said second base film so that said first surface coating layer is exposed on its bottom and said second base film is exposed on its inner peripheral side face, depositing a second electroless plating layer by electroless plating at least on a surface of said second base film exposed on inner peripheral side face of said second hole and growing a second electrolytic plating layer by electrolytic plating on a surface of said second electroless plating layer so as to fill said second hole with said second electrolytic plating layer.

In one aspect of a method of manufacturing a flexible wiring board according to the present invention, said second surface conductive layer is a metal foil and adhered to said second base film.

In one aspect of a method of manufacturing a flexible wiring board according to the present invention, the method further includes the step of patterning said second surface conductive layer.

In one aspect of a method of manufacturing a flexible wiring board according to the present invention, the method further includes the step of providing a third base film and a third surface conductive layer on the surface of said reference conductive layer opposite to the side where said first base film is provided, forming a third hole penetrating said third surface conductive layer and said third base film so that said reference conductive layer is exposed on its bottom and said third base film is exposed on its inner peripheral side face, depositing a third electroless plating layer by electroless plating at least on a surface of said third base film exposed on inner peripheral side face of said third hole, growing a third electrolytic plating layer by electrolytic plating on a surface of said third electroless plating layer so as to fill said third hole with said third electrolytic plating layer, and removing said third electrolytic plating layer and said third electroless plating layer provided on said third surface conductive layer so as to expose said third surface conductive layer.

Furthermore, in one aspect of a method of manufacturing a flexible wiring board according to the present invention, the method further includes the steps of patterning said third surface conductive layer.

According to one aspect of a method of manufacturing a flexible wiring board according to the present invention, after the conductive material is grown in the first hole and on the surface of the first base film to form the first coating conductive layer, a thickness of the first coating conductive layer is reduced to form the first conductive layer.

As described above, when the first conductive layer is formed by reducing a thickness of the first coating conductive layer in this manner, a pattern width of the patterned first conductive layer is not reduced even in the case where, for example, the first conductive layer is patterned by using isotropic etching such as wet etching in the following step, contrary to a conventional case where a considerably thick coating conductive layer is patterned by etching. Therefore, a desired pattern width can be obtained. Moreover, even in the case where a multi-layered flexible wiring board is formed, a thickness of the first conductive layer is reduced to also reduce a total thickness of a wiring board itself, which in turn reduces weight of the wiring board itself.

In embodiments of the present invention, the following structure may be employed. A second base film is formed on the first conductive layer and a second surface conductive layer is provided on the surface of the second base film. A second hole having an aperture penetrating the second base film opposite to the side where the first conductive layer is formed. Then, a conductive material is grown in the second hole and on the surface of the second surface conductive layer, thereby forming a second coating conductive layer. Thereafter, a thickness of the second coating conductive layer is reduced to form the second conductive layer.

In such a structure, a single-layered flexible wiring board can be built up onto a surface of another flexible wiring board on the surface of substrate where the first conductive layer is provided. By successively repeating the build-up of the surface where the first conductive layer is provided, a multi-layered flexible wiring board composed of two or more layers can be built up on the flexible wiring board on the side where the first conductive layer is formed. In this case, since a thickness of the second conductive layer is reduced, a pattern width of the patterned second conductive layer is not reduced as in the case of the first conductive layer, even in the case where the second conductive layer is patterned. Furthermore, the first and second conductive layers are thinned to reduce the thickness of the wiring board.

In embodiments of the present invention, the following structure may alternatively be employed. The third base film is formed on a surface of the reference conductive layer, opposite to the side where the first base film is provided and a third surface conductive layer is provided on the surface of the third conductive layer. The third hole having an aperture penetrating the third surface conductive layer and the third base film is formed. Then, a conductive material is grown on the surface of the third base film at the inner side of the third hole, and on the surface of the third surface conductive layer to form the third coating conductive layer. Thereafter, a thickness of the third coating conductive layer is reduced to form a third conductive layer.

In such a structure, a single-layered flexible wiring board can be built up on the first base film, opposite to the side where the first conductive layer is formed. By successively repeating the build-up of flexible wiring boards on the surface opposite to the side where the first conductive layer is formed, a multi-layered flexible wiring board can be built up on the surface opposite to the side where the first conductive layer is formed. Moreover, even in the case where the third conductive layer is patterned, a pattern width of the patterned third conductive layer is not reduced, as in the first and second conductive layers. Furthermore, the second and third conductive layers are thinned to reduce a thickness of the wiring board.

In certain embodiments of the present invention, in the step of reducing a thickness of at least any one of the first to the third coating conductive layers, the reducing may be subjected to wet etching. Moreover, a surface of at least one of the first to the third coating conductive layers may be physically polished to have a reduced thickness.

In embodiments the present invention, the following structure may be employed. A thin film made of the first conductive material is grown on the surface of the first base film by electroless plating. Thereafter, a voltage is applied to the grown thin film so as to further deposit the first conductive material on a surface of the grown thin film by electrolytic plating.

In such a structure, even on the surface of the first base film on which a thin film cannot be directly formed by electrolytic plating because it is made of an insulating material, the thin film made of the first conductive material can be grown by electroless plating. Thereafter, the first conductive material is deposited on a surface of the thin film made of the first conductive material by electrolytic plating. Since a deposition rate can be controlled by the amount of a current in electrolytic plating, the amount of a current is increased to increase a deposition rate, whereby a thick film made of the first conductive material can be grown in a short period of time. Similarly, after thin films made of the second and third conductive materials are first grown on the surfaces of the second and third base films by electroless plating, the second and third conductive materials are deposited by electrolytic plating on the surfaces of the respective thin films. As a result, the thick films of the second and third conductive materials can be grown on the surfaces of the second and third base films in a short period of time.

Figure 65:
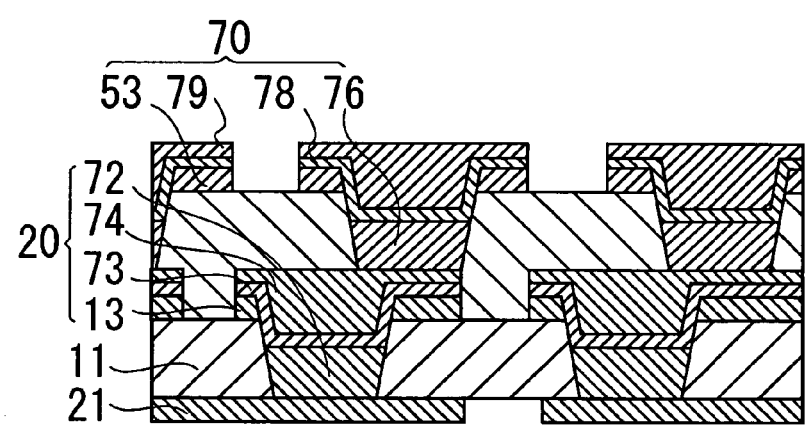
Figure 66:
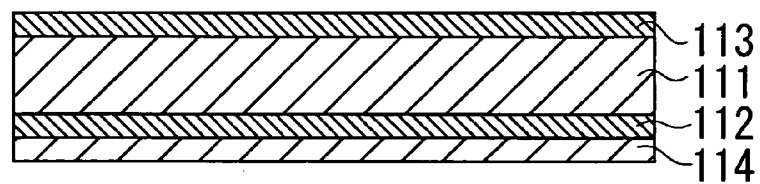
Figure 67:
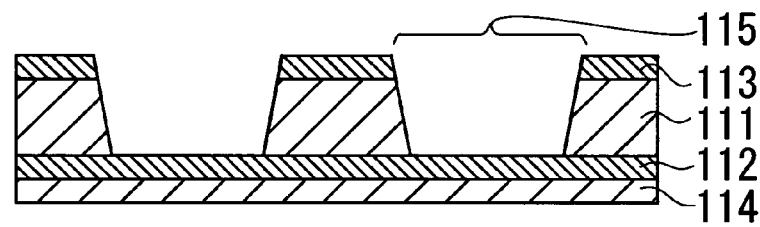
Figure 68:
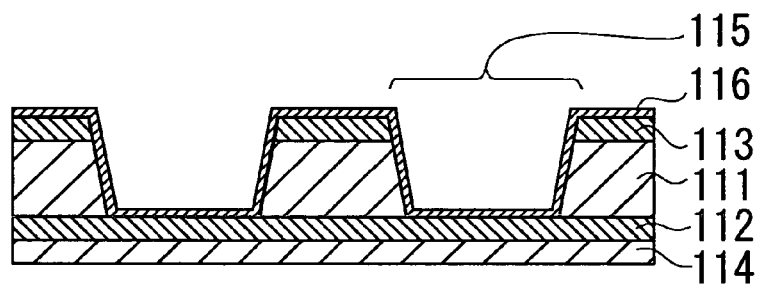
Figure 69:
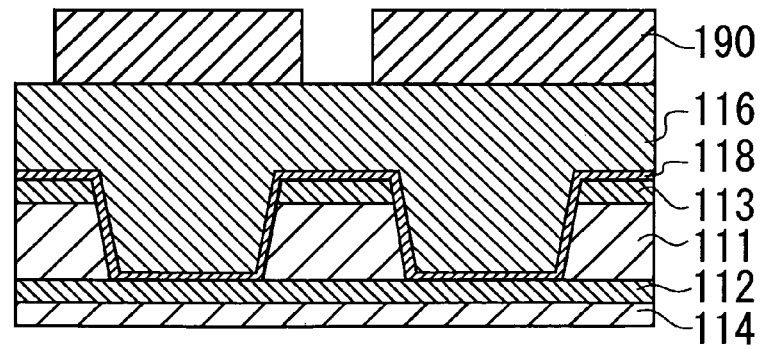
Figure 70:
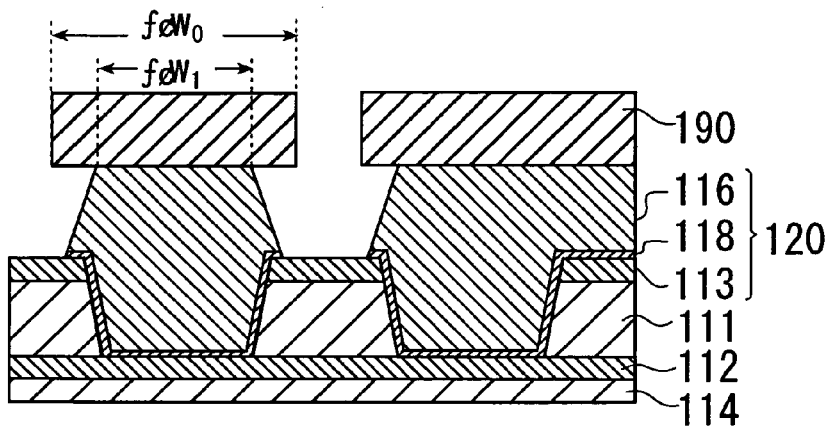
Figure 71:
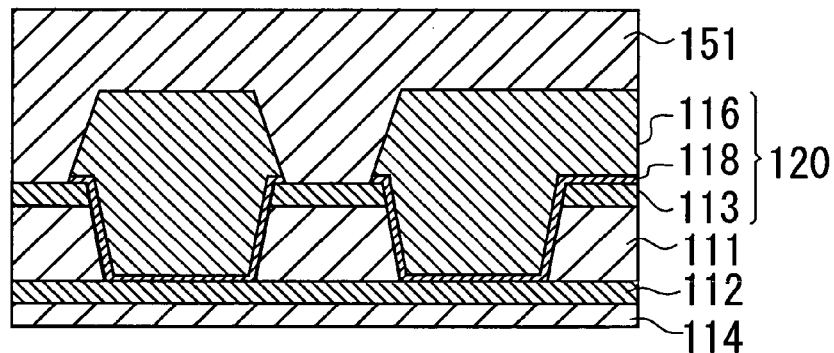
Figure 72:
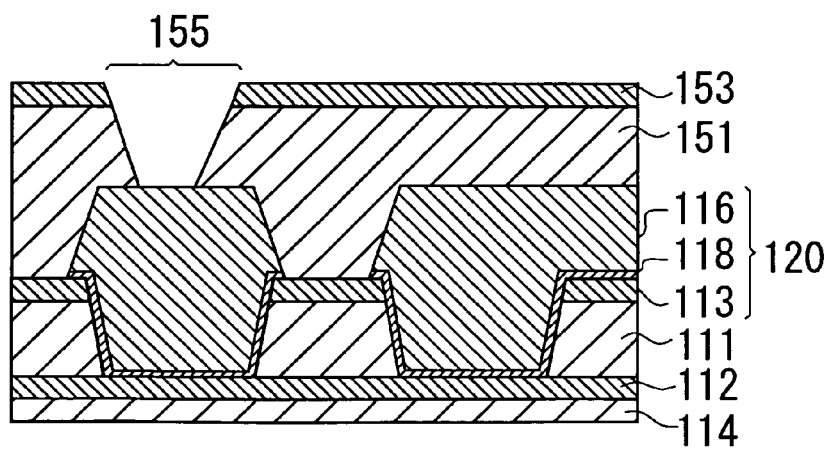
Figure 73:
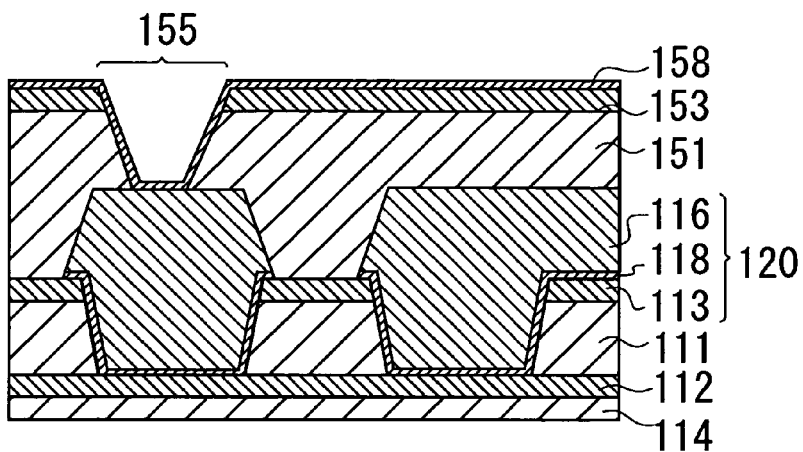
Figure 74:
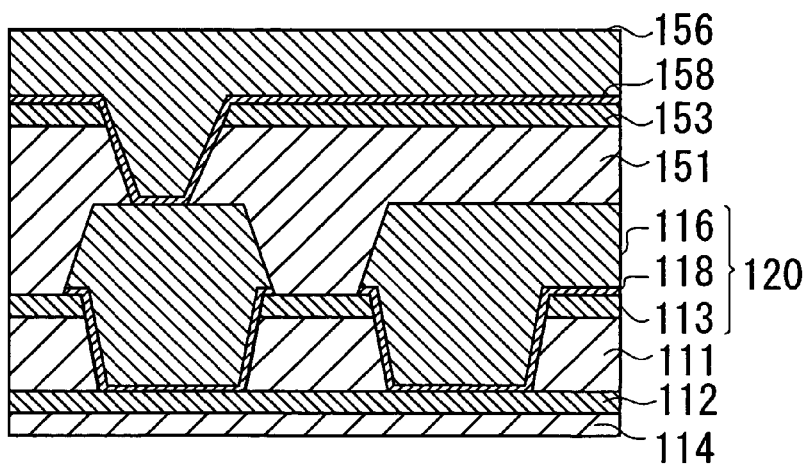
Figure 75:
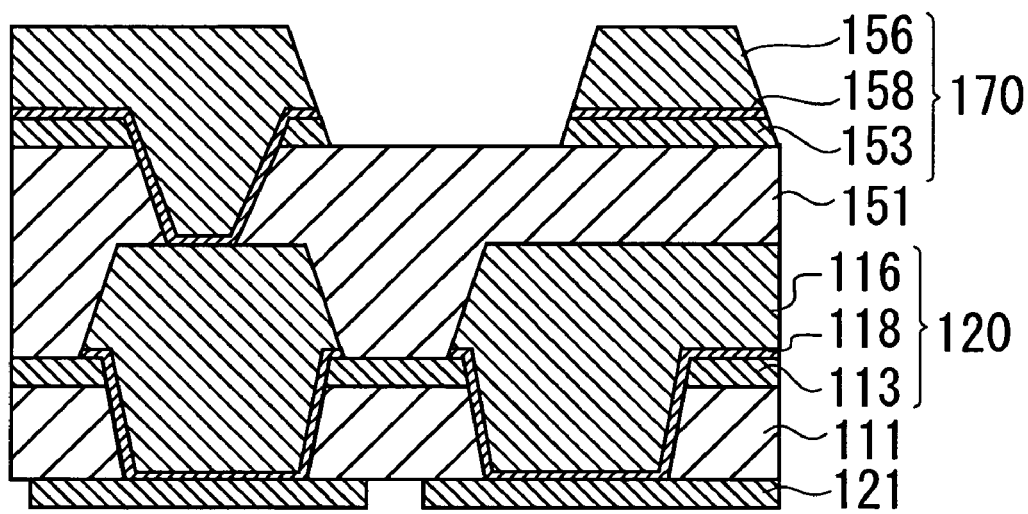

64B is a thirty-second cross section for illustrating the method of manufacturing the flexible wiring board according to the further embodiment of the present invention;

FIG. 65 is a thirty-third cross section for illustrating the method of manufacturing the flexible wiring board according to the further embodiment of the present invention;

FIG. 66 is a first view for illustrating a conventional method of manufacturing a flexible wiring board;

FIG. 67 is a second view for illustrating the conventional method of manufacturing the flexible wiring board;

FIG. 68 is a third view for illustrating the conventional method of manufacturing the flexible wiring board;

FIG. 69 is a fourth view for illustrating the conventional method of manufacturing the flexible wiring board;

FIG. 70 is a fifth view for illustrating the conventional method of manufacturing the flexible wiring board;

FIG. 71 is a sixth view for illustrating the conventional method of manufacturing the flexible wiring board;

FIG. 72 is a seventh view for illustrating the conventional method of manufacturing the flexible wiring board;

FIG. 73 is an eighth view for illustrating the conventional method of manufacturing the flexible wiring board;

FIG. 74 is a ninth view for illustrating the conventional method of manufacturing the flexible wiring board; and FIG. 75 is a tenth view for illustrating the conventional method of manufacturing the flexible wiring board.

BRIEF DESCRIPTION OF REFEREBCE NUMERAL

In each of the accompanying drawings, the following components are commonly denoted by the reference numerals as follows: Reference numerals 1, 2 denote flexible wiring boards; 11 denotes a first base film; 12 denotes a reference conductive layer; 13 denotes a first surface conductive layer; 15 denotes a first via hole; 16 denotes a first conductive material; 18 denotes a first electroless plating layer; 74 denotes a first surface-side conductive material; 20 denotes a first wiring layer; 21 denotes a reference wiring layer; 51 denotes a second base film; 53 denotes a second surface conductive layer; 55 denotes a second via hole; 76 denotes a second bottom-side conductive material; 70 denotes a second wiring layer; 91 denotes a first coating conductive layer; 92 denotes a first conductive layer; 93 denotes a second coating conductive layer; and 94 denotes a second conductive layer.

DETAILED DESCRIPTION OF THE PREFERRED EMBODIMENTS

Hereinafter, embodiments of the present invention will be described with reference to the accompanying drawings.

FIGS. 1 to 26 are views for illustrating the manufacturing steps of a flexible wiring board according to one embodiment of the present invention.

With reference to the below embodiments, suitable polyimide polymers are decribed in Japanese laid open Application No. 2000-151046 and Japanese laid open Application No. 2000-186143, and may be produced from the combinations of pyromellitic dianhydride/diaminodiphenyl ether, diphenyltetra carboxylic dianhydride/p-phenylenediamine and the like. Examples of suitable electrolytic plating solutions include acid copper sulfate plating solution, copper pyrophosophate plating solution, and the like. Examples of electroless plating solutions include a solution comprising a copper salt (such as copper sulfate), a reducing agent (such as formaldehyde, or hydrazine), a pH adjusting agent (such as NaOH, or KOH), a chelating agent (such as EDTA, or Rochelle salt), and an addition agent (such as polyethylene glycol, or dipyridyl). Those having ordinary skill in the art will recognize that the above solutions and agents are simply representative and that other solutions may be used. Suitable concentrations and amounts used are also known to those having ordinary skill in the art.

Figure 1:
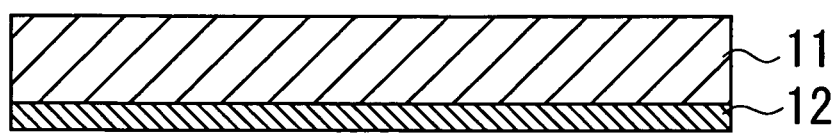
FIG. 1 is a first cross section illustrating a method of manufacturing a single-layered flexible wiring board according to one embodiment of the present invention.

First, after a polyimide precursor solution is applied onto a surface of a metal foil made of copper, the polyimide precursor solution is semi-cured to form a first base film made of polyimide. This state is shown in FIG. 1, where reference numerals 12 denotes the metal foil (hereinafter, referred to as a reference conductive layer) and 11 denotes the first base film. In this state, the first base film 11 and the reference conductive layer 12 are in close contact with each other.

Figure 2:
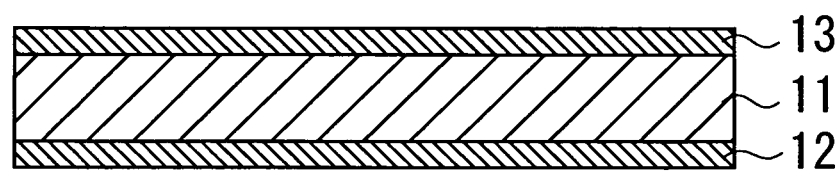
FIG. 2 is a second cross section illustrating the method of manufacturing the single-layered flexible wiring board according to one embodiment of the present invention.

Next, as shown in FIG. 2, a second metal foil (hereinafter, referred to as a first surface conductive layer) 13 is placed on a surface of the first base film 11. The first surface conductive layer 13 is heated while being pressed against the first base film 11 so as to adhere the first surface conductive layer 13 and the first base film 11 to each other. In this state, the first base film 11 is sandwiched between the reference conductive layer 12 and the first surface conductive layer 13. In this case, each of the reference conductive layer 12 and the first surface conductive layer 13 has a thickness of 30 μm, and the first base film 11 has a thickness of 35 μm.

Figure 3:
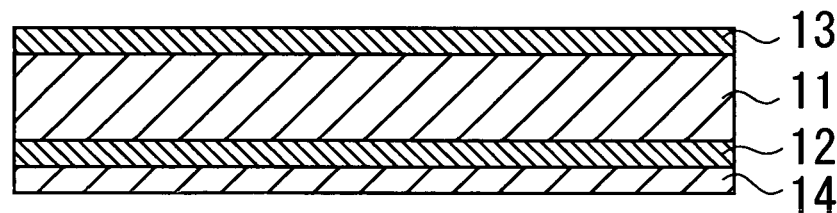
FIG. 3 is a third cross section illustrating the method of manufacturing the single-layered flexible wiring board according to one embodiment of the present invention.

Subsequently, as shown in FIG. 3, a carrier film 14 made of polyethylene terephthalate (PET) is provided onto a surface of the reference conductive layer 12. In this state, the surface of the reference conductive layer 12 is completely covered with the carrier film 14.

Figure 4:
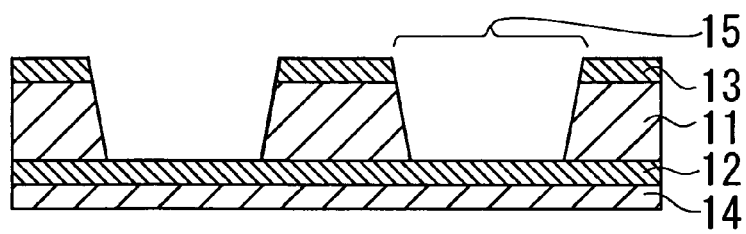
FIG. 4 is a fourth cross section illustrating the method of manufacturing the single-layered flexible wiring board according to one embodiment of the present invention.

Next, the surface of the first surface conductive layer 13 is irradiated with laser light at a predetermined position for a plurality of times. As a result, the first surface conductive layer 13 and the first base film 11 are removed at the laser irradiated position to form a first via hole penetrating the first surface conductive layer 13 and the first base film 11 to reach the reference conductive layer 12 at the bottom of the via hole. This state is shown in FIG. 4. A reference numeral 15 denotes first via hole. The first via hole 15, which is an example of a first hole of the present invention, has an opening diameter of about 50 μm and a depth of about 35 μm.

Figure 5:
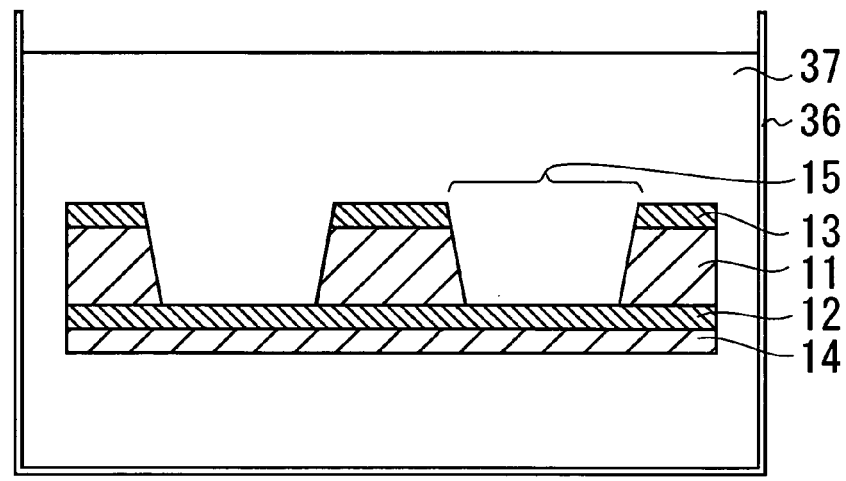
FIG. 5 is a fifth cross section illustrating the method of manufacturing the single-layered flexible wiring board according to one embodiment of the present invention.

Subsequently, as shown in FIG. 5, the above-described first base film 11 is immersed into an electroless plating solution 37 in a container 36.

Figure 6:
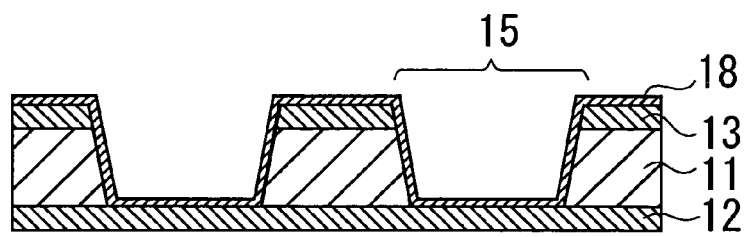
FIG. 6 is a sixth cross section illustrating the method of manufacturing the single-layered flexible wiring board according to one embodiment of the present invention.

As a result, a first electroless plating layer made of copper is grown over the surface of the first surface conductive layer 13 to a surface of the first base film 11 which is exposed on the inner side face of the first via hole 15 and a surface of the reference conductive layer 12 which is exposed on the bottom face of the first via hole 15. When a thickness of the first electroless plating layer substantially reaches a predetermined thickness (5 μm in this embodiment), the first base film 11 is taken out of the electroless plating solution 37 to terminate the growth. Then, the carrier film 14 is stripped off. This state is shown in FIG. 6, where the thus formed first electroless plating layer is denoted by reference numeral 18, which is electrically connected to the reference conductive layer 12.

Figure 7:
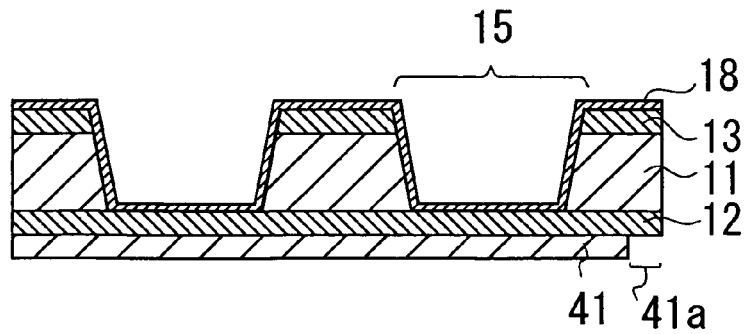
FIG. 7 is a seventh cross section illustrating the method of manufacturing the single-layered flexible wiring board according to one embodiment of the present invention.

Next, as shown in FIG. 7, after another carrier film 41 is provided onto the surface of the reference conductive layer 12, a part of the carrier film 41 is etched away to form an opening 41*a*.

Figure 8:
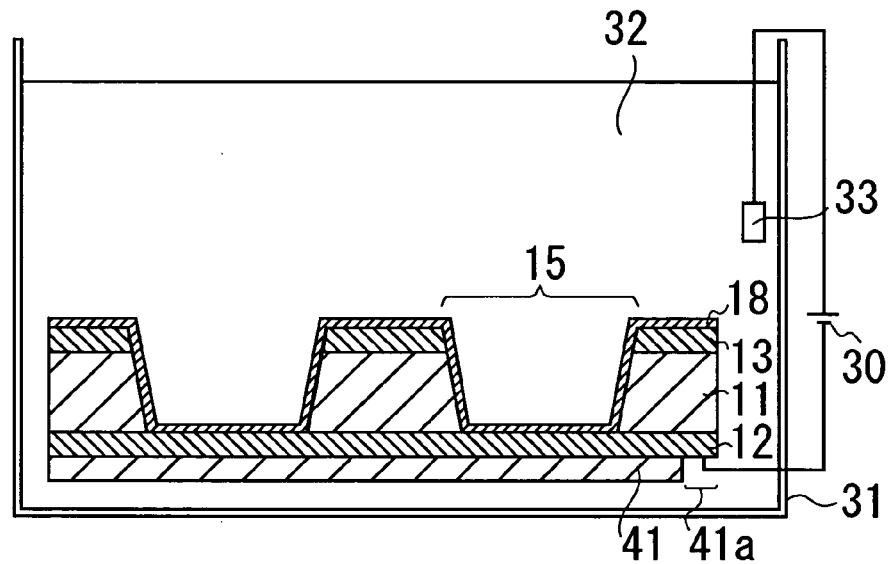
FIG. 8 is an eighth cross section illustrating the method of manufacturing the single-layered flexible wiring board according to one embodiment of the present invention.

Next, as shown in FIG. 8, a DC power source 30, an electrode 33 for electrolysis, a container 31, and an electrolytic plating solution 32 containing copper in the container 31 are prepared. A negative pole and a positive pole of the DC power source 30 are connected to the reference conductive layer 12 exposed through the opening 41*a* and to the electrode 33, respectively. In this state, the first base film 11 and the electrode 33 are immersed into the electrolytic plating solution 32.

Figure 9:
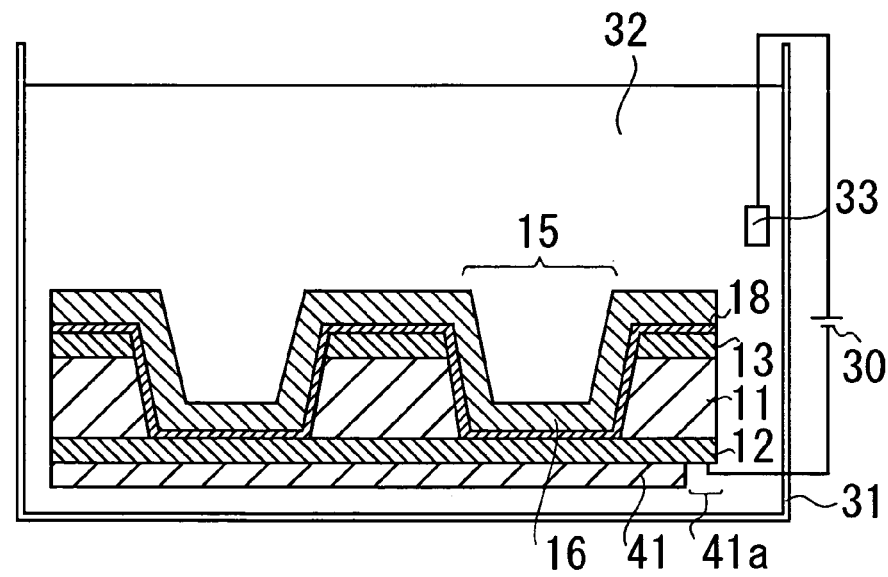
FIG. 9 is a ninth cross section illustrating the method of manufacturing the single-layered flexible wiring board according to one embodiment of the present invention.
Figure 10:
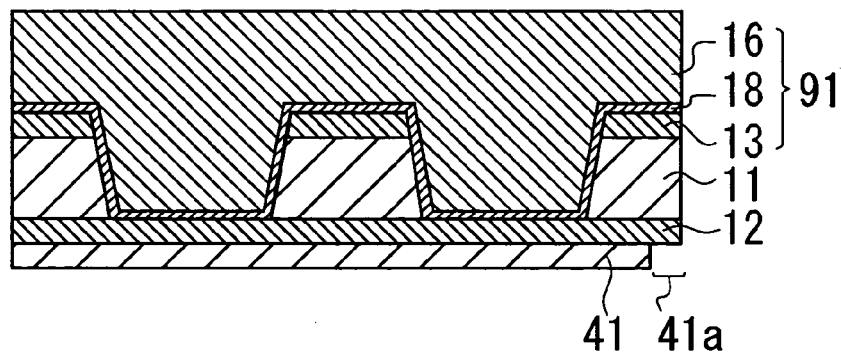
FIG. 10 is a tenth cross section illustrating the method of manufacturing the single-layered flexible wiring board according to one embodiment of the present invention.

Next, as shown in FIG. 9, when the DC power source 30 is activated to apply a DC voltage between the electrolytic plating solution 32 and the reference conductive layer 12, the electrolytic plating solution 32 is electrolyzed. As a result, a first conductive material 16 made of copper starts growing on the surface of the first electroless plating layer 18 that is connected to the negative pole through the reference conductive layer 12. The first electroless plating layer 18 is provided on the entire surface so as to cover the inner surface of the first via hole 15 and the surface of the first surface conductive layer 13. Therefore, the grown first conductive material 16 completely fills the first via hole 15 while covering the entire surface of the first base film 11. When the first conductive material 16 is sufficiently grown to completely fill the first via hole 15 so as to provide a flat surface for the first conductive material 16 as shown in FIG. 10, the application of the DC voltage is stopped to terminate the growth. Herein, when the first conductive material 16 is grown to a thickness of 60 μm from the surface of the reference conductive layer 12 that is exposed on the bottom of the first via hole 15, the growth is terminated. An upper part composed of the thus grown first conductive material 16, the first electroless plating layer 18, and the first surface conductive layer 13, which is situated above the surface of the first base film 11, comprises a first coating conductive layer of the present invention. The first coating conductive layer is denoted by reference numeral 91 in FIG. 10.

Figure 11:
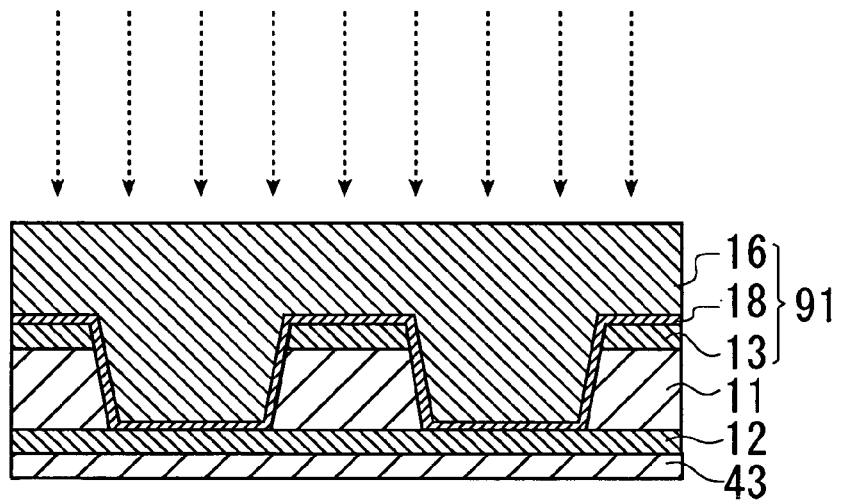
FIG. 11 is an eleventh cross section illustrating the method of manufacturing the single-layered flexible wiring board according to one embodiment of the present invention.

Next, as shown in FIG. 11, an etchant such as a mixed solution of a hydrogen peroxide solution and sulfuric acid (sold under the name: CP 750 distributed by Mitsubishi Gas Chemical Company, Inc.) is sprayed from a shower nozzle (not shown) onto a surface of the first coating conductive layer 91. As a result, the first coating conductive layer 91 is etched to have a reduced thickness.

Figure 12:
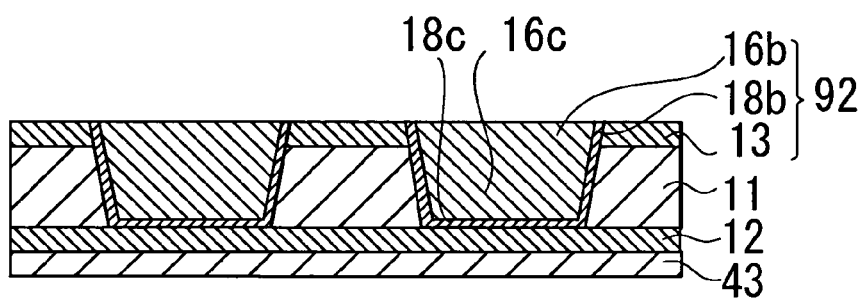
FIG. 12 is a twelfth cross section illustrating the method of manufacturing the single-layered flexible wiring board according to one embodiment of the present invention.

The amount of required time from the beginning of etching, to completely remove the first conductive material 16 and the first electroless plating layer 18, which are formed on the surface of the first surface conductive layer 13, is obtained in advance by an experiment or the like. When the first coating conductive layer 91 is etched for this required amount of time, the first conductive material 16 and the first electroless plating layer 18 are completely removed at termination of etching, resulting in the entirely exposed surface of the first surface conductive layer 13. This state is shown in FIG. 12.

As a result of such etching, the first conductive material 16 and the first electroless plating layer 18 remain in the first via hole 15, whereas the first surface conductive layer 13 remains on the surface of the first base film 11 where the first via hole 15 is not formed. A part of the remaining first conductive material 16 and a part of the remaining first electroless plating layer 18 provided at the vicinity of the surface of the substrate comprising the first base film 11, the reference conductive layer 12 and the first surface conductive layer 13, are respectively labeled a first electroless plating layer 18*b* and a first conductive material 16*b*. The first electroless plating layer 18*b*, the first conductive material 16*b*, and the first surface conductive layer 13 comprise a first conductive layer according to the present invention. The first conductive layer 92 in FIG. 12 is connected to the reference conducive layer 12 through the first conductive material 16*c* and the first electroless plating layer 18*c* which are provided on the bottom of the first via hole 15.

Figure 13:
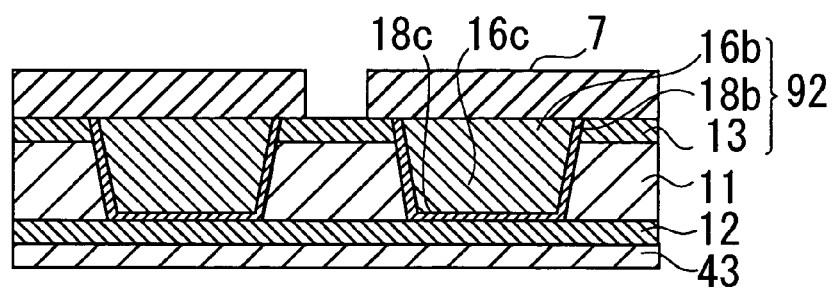
FIG. 13 is a thirteenth cross section illustrating the method of manufacturing the single-layered flexible wiring board according to one embodiment of the present invention.

Next, as shown in FIG. 13, after a resist is applied onto a surface of the first conductive layer 92, the resist is patterned into a desired pattern to form a resist film 7.

Figure 14:
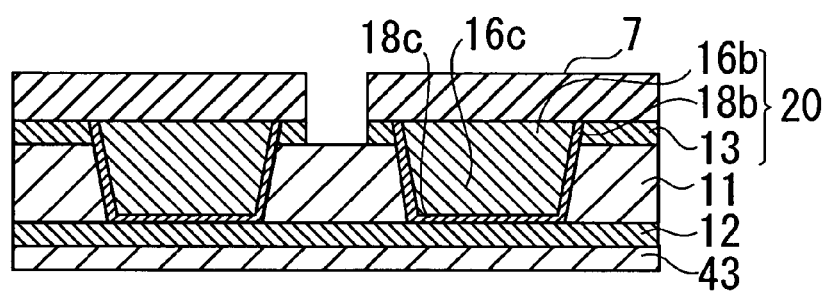
FIG. 14 is a fourteenth cross section illustrating the method of manufacturing the single-layered flexible wiring board according to one embodiment of the present invention.

Next, as shown in FIG. 14, the first conductive layer 92 is etched by isotropic etching such as wet etching, using the resist film 7 as a mask. Since only the first surface conductive layer 13 of the first surface conductive layer 92 is exposed on the bottom of an opening of the resist film 7 before etching, the etching of the first conductive layer 92 allows only the first surface conductive layer 13 to be etched, and the first base film is exposed.

Since the first surface conductive layer 13 is thin, a pattern width of the patterned first surface conductive layer 13 is not reduced different from conventionally happens in the case where a thick conductive layer is etched.

The patterned first surface conductive layer 13, the first electroless plating layer 18*b*, and the first conductive material 16*b*, which are placed above the surface of the first base film 11, are collectively referred to as a first wiring layer 20 hereinafter. A pattern of the first wiring layer 20 is the same as that of the resist film 7.

Figure 15:
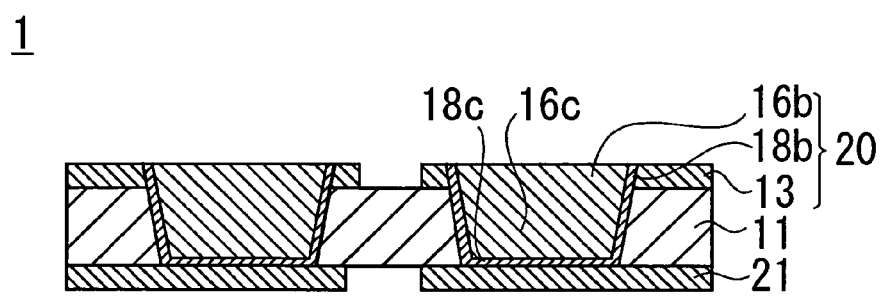
FIG. 15 is a fifteenth cross section illustrating the method of manufacturing the single-layered flexible wiring board according to one embodiment of the present invention.

Thereafter, as shown in FIG. 15, after the resist film 7 is stripped off, followed by stripping of the carrier film 43, the reference conductive layer 12 is patterned into a desired pattern to form a reference wiring layer 21. As a result, the single-layered flexible wiring board 1 as shown in FIG. 15 is completed.

In this embodiment, as described above, after formation of the first coating conductive layer 91, the first coating conductive layer 91 is etched to have a reduced thickness as described with reference to FIG. 12. The first conductive layer 92 having a reduced thickness is patterned by etching to form the first wiring layer 20. Therefore, contrary to a conventional case where a considerably thick conductive material is patterned to reduce a pattern width to be smaller than a desired pattern width, a pattern of the first wiring layer 20 is substantially identical with the pattern of the resist film 7 serving as a mask, thereby obtaining a desired pattern.

It seems that it is not necessary to reduce a thickness of the first coating conductive layer 91 having a large thickness after formation of the first coating conductive layer 91 as in this embodiment because, if the thin first conductive material 16 is formed to have a small thickness at the beginning of manufacture when the first conductive material 16 is to be formed, the first conductive material 16 having a small thickness may be obtained without etching.

However, if the first conductive material 16 is formed thin, the first via hole 15 is not completely filled with the first conductive material 16. Therefore, a dent is generated at the position where the first via hole 15 is formed. Accordingly, when a multi-layered wiring board is formed, in particular, connection failure adversely occurs between a plurality of layers.

Therefore, in this embodiment, after the thick first conductive material 16 is formed to completely fill the first via hole 15, a thickness of the thick first conductive material 16 is reduced by etching. With such a structure, the first via hole 15 is completely filled with the first conductive material 16 without fail.

Figure 16A:
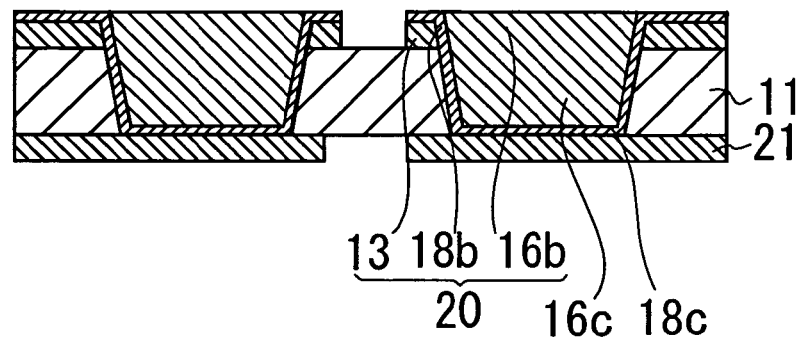
FIG. 16A is a cross section for illustrating a structure including a first electroless plating layer on a surface of a first surface conductive layer in the single-layered flexible wiring board according to one embodiment of the present invention.

In the above-described embodiment, when the first coating conductive layer 91 is etched to have a reduced thickness, the first conductive material 16 and the first electroless plating layer 18 which are placed on the first surface conductive layer 13, are entirely removed. However, the present invention is not limited thereto. For example, the following structure may alternatively be employed. When the first coating conductive layer 91 is thinned by etching, only the first conductive material 16 that is situated on the first surface conductive layer 13 may be completely removed while the first electroless plating layer 18 provided on the first surface conductive layer 13 is left. In this manner, the first wiring layer 20 including the first electroless plating layer 18 placed on the first surface conductive layer 13 is formed as shown in FIG. 16A.

Figure 16B:
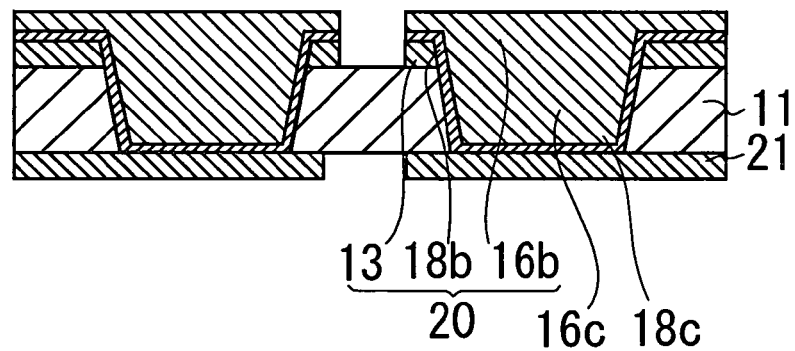
FIG. 16B is a cross section for illustrating a structure including the first electroless plating layer and a first conductive material sequentially deposited on the surface of the first surface conductive layer in the single-layered flexible wiring board according to one embodiment of the present invention.

Alternatively, another structure as follows may also be employed. When the first coating conductive layer 91 is thinned by etching, the first electroless plating layer 18 and the first conductive material 16 are left on the first surface conductive layer 13 without completely removing, and in the result, the first conductive material 16 provided on the first surface conductive layer 13. In this manner, the first wiring layer 20 including the first electroless plating layer 18 and the thinned first conductive material 16 provided on the first surface conductive layer 13 is formed as shown in FIG. 16B.

Although the method of manufacturing the single-layered flexible wiring board has been described so far, the present invention is not limited thereto. The present invention is also applicable to the manufacture of a multi-layered flexible wiring board.

Hereinafter, a method of manufacturing a multi-layered flexible wiring board will be described. FIGS. 17 to 28 are cross sectional views for illustrating a method of manufacturing a double-layered flexible wiring board which is an example of a multi-layered flexible wiring board.

Figure 17:
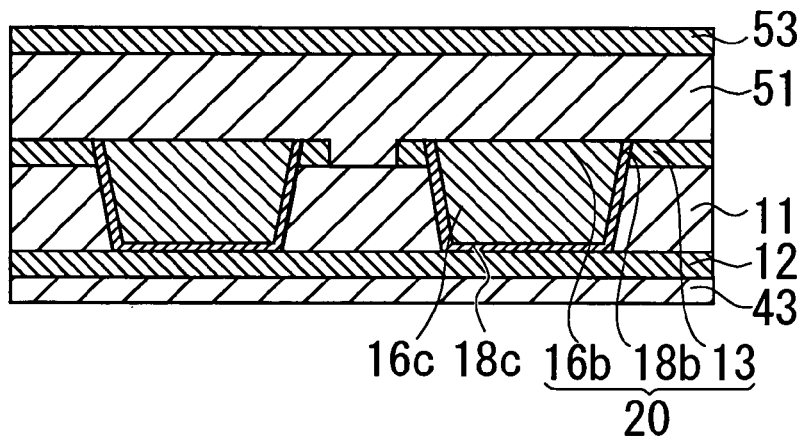
FIG. 17 is a first cross section for illustrating a method of manufacturing a double-layered flexible wiring board according to one embodiment of the present invention.

Through the steps illustrated in FIGS. 1 to 12, a state shown in FIG. 13, that is, the first base film 11, on which the first wiring layer 20 is formed, is obtained. Thereafter, the resist film 7 is stripped off. After a polyimide precursor solution is applied onto the surface of the first base film 11 and the surface of the first wiring layer 20, the polyimide precursor solution is semi-cured to form a second base film. Thereafter, a metal foil is placed on a surface of the second base film. Then, the metal foil is heated while being pressed against the second base film so as to adhere the metal foil (hereinafter, referred to as a second surface conductive layer) and the second base film to each other. The bonded state is shown in FIG. 17. Reference numeral 51 in FIG. 17 denotes the second base film, and reference numeral 53 denotes the second surface conductive layer.

Figure 18:
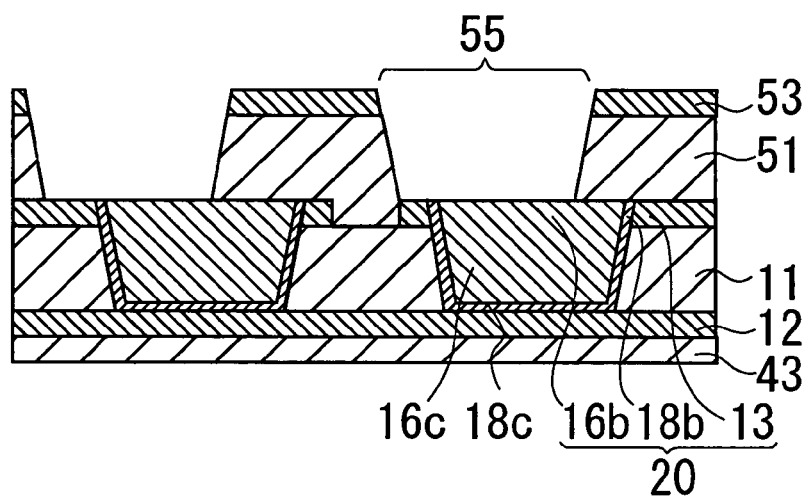
FIG. 18 is a second cross section for illustrating the method of manufacturing the double-layered flexible wiring board according to one embodiment of the present invention.

Next, as shown in FIG. 18, the surface of the second surface conductive layer 53 is irradiated with laser light at a predetermined position for a plurality of times so as to remove the second surface conductive layer 53 and the second base film 51. In this manner, a second via hole 55 is formed so as to penetrate the second surface conductive layer 53 and the second base film 51 to reach the surface of the first wiring layer 20 at its bottom. The second via hole 55 is an example of a second hole according to the present invention.

Figure 19:
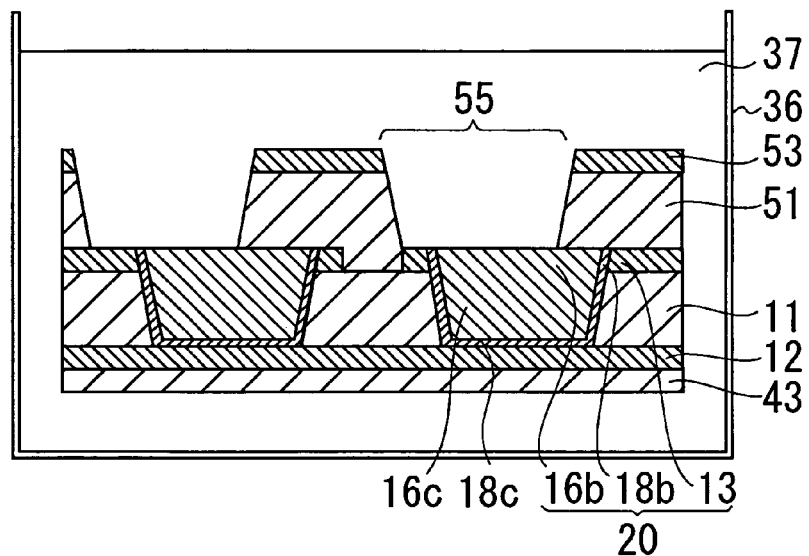
FIG. 19 is a third cross section for illustrating the method of manufacturing the double-layered flexible wiring board according to one embodiment of the present invention.
Figure 20:
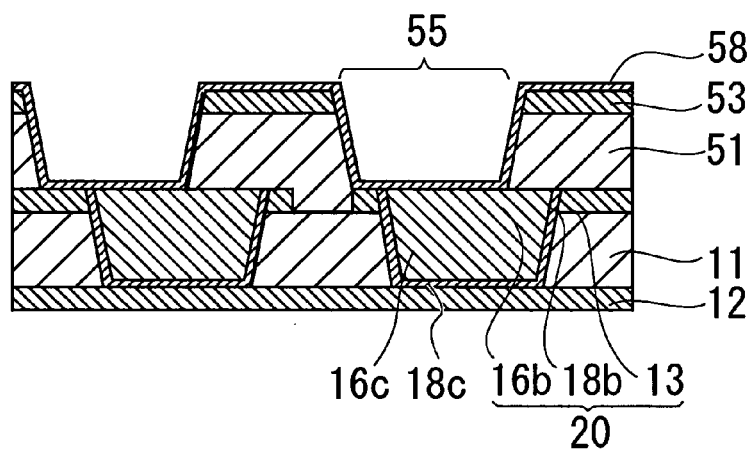
FIG. 20 is a fourth cross section for illustrating the method of manufacturing the double-layered flexible wiring board according to one embodiment of the present invention.

Next, as shown in FIG. 19, the above-described first base film 11 is immersed into an electroless plating solution 37 in a container 36. Then, a second electroless plating layer made of copper is grown on the inner surface of the second via hole 55 over the surface of the second surface conductive layer 53. When the second electroless plating layer attains a predetermined thickness (in this case, 5 μm), the first base film 11 is taken out of the electroless plating solution 37 to terminate the growth. Then, the carrier film 43 is stripped off. This state is shown in FIG. 20, where reference numeral 58 denotes the thus grown second electroless plating layer.

Figure 21:
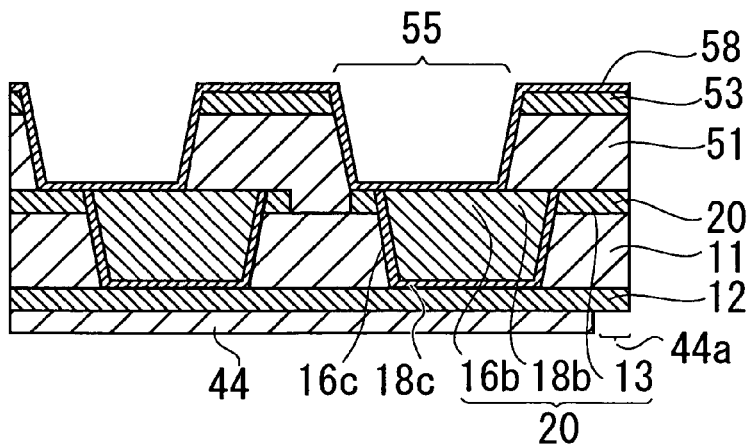
FIG. 21 is a fifth cross section for illustrating the method of manufacturing the double-layered flexible wiring board according to one embodiment of the present invention.

Next, as shown in FIG. 21, another carrier film 44 is provided onto a surface of the reference conductive layer 12. A part of the carrier film 44 is etched away to form an opening 44a so as to expose a part of the reference conductive layer 12 through the opening 44a.

Figure 22:
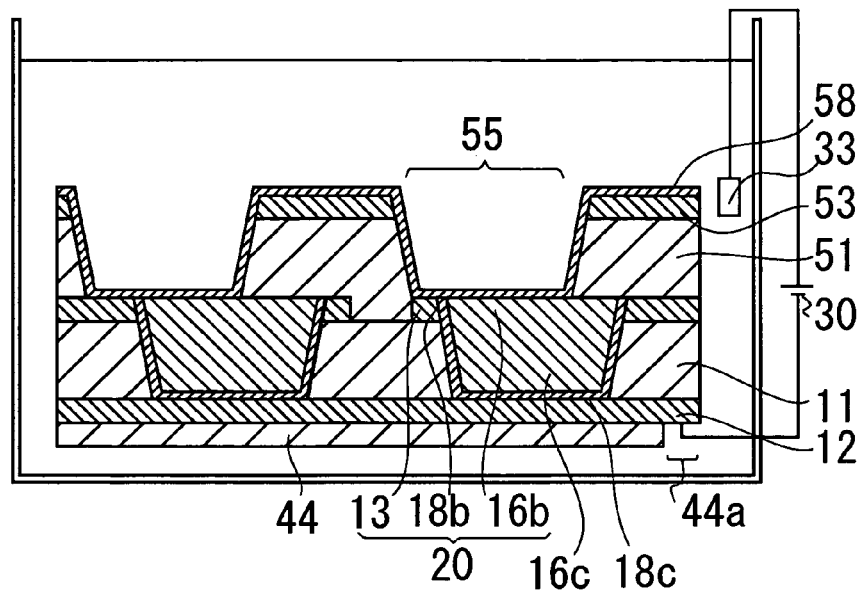
FIG. 22 is a sixth cross section for illustrating the method of manufacturing the double-layered flexible wiring board according to one embodiment of the present invention.

Subsequently, as shown in FIG. 22, a negative pole and a positive pole of the DC power source 30 are connected to the reference conductive layer 12 that is exposed through the opening 44a and the electrode 33, respectively. In this state, the first base film 11 and the electrode 33 are immersed into the electrolytic plating solution 32 containing copper in the container 31.

Figure 23:
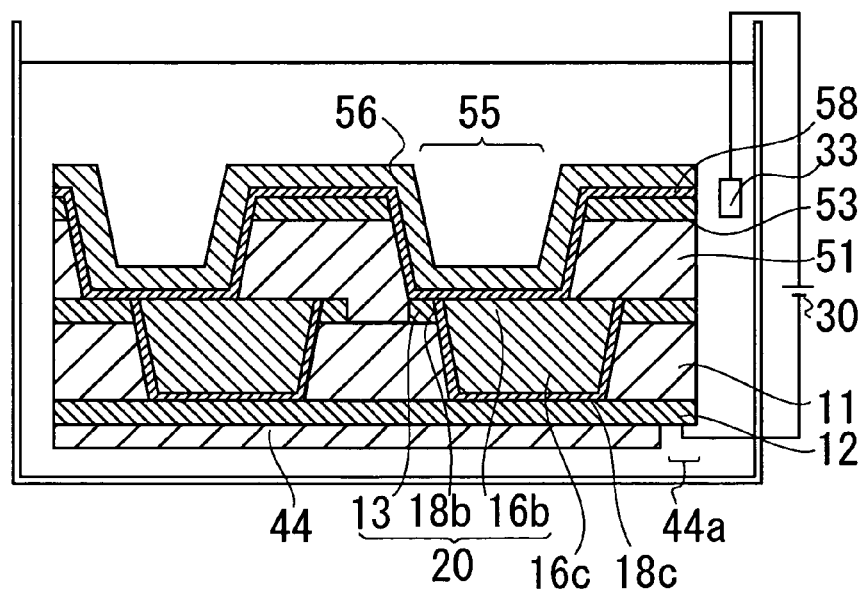
FIG. 23 is a seventh cross section for illustrating the method of manufacturing the double-layered flexible wiring board according to one embodiment of the present invention.
Figure 24:
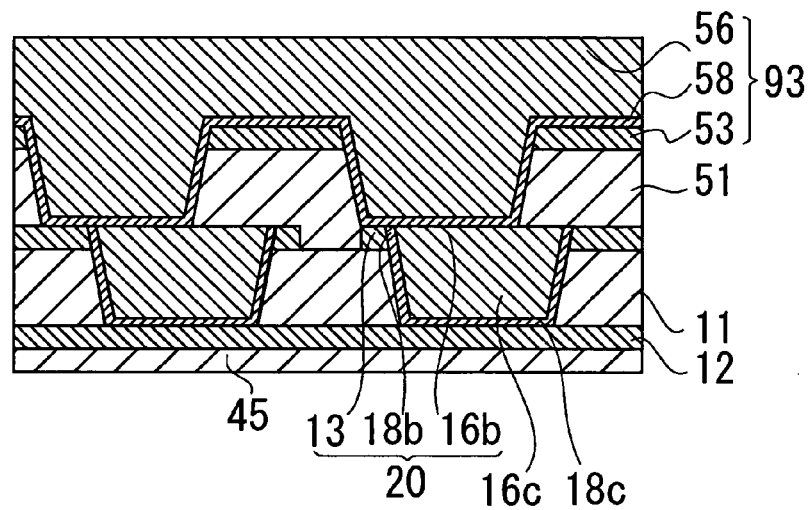
FIG. 24 is an eighth cross section for illustrating the method of manufacturing the double-layered flexible wiring board according to one embodiment of the present invention.

Next, when the DC power source 30 is activated to apply a DC voltage between the electrolytic plating solution 32 and the reference conductive layer 12 as shown in FIG. 23, the electrolytic plating solution 32 is electrolyzed. As a result, a second conductive material 56 made of copper starts growing on the surface of the second electroless plating layer 58 that is connected to the negative pole through the first wiring layer 20. When the growth of the second conductive material 56 proceeds so as to completely fill the second via hole 55 to provide a flat surface for the second conductive material 56 as shown in FIG. 24, the application of the DC voltage is stopped to terminate the growth. Herein, when the second conductive material 56 is grown to a thickness of 60 μm from the surface of the second electroless plating layer 58 that is situated on the surface of the second surface conductive layer 53, the growth is terminated. An upper part composed of the thus grown second conductive material 56, the second electroless plating layer 58, and the second surface conductive layer 53, which is situated above the surface of the second base film 51 comprises a second coating conductive layer of the present invention. The second coating conductive layer is denoted by reference numeral 93 in FIG. 24.

Figure 25:
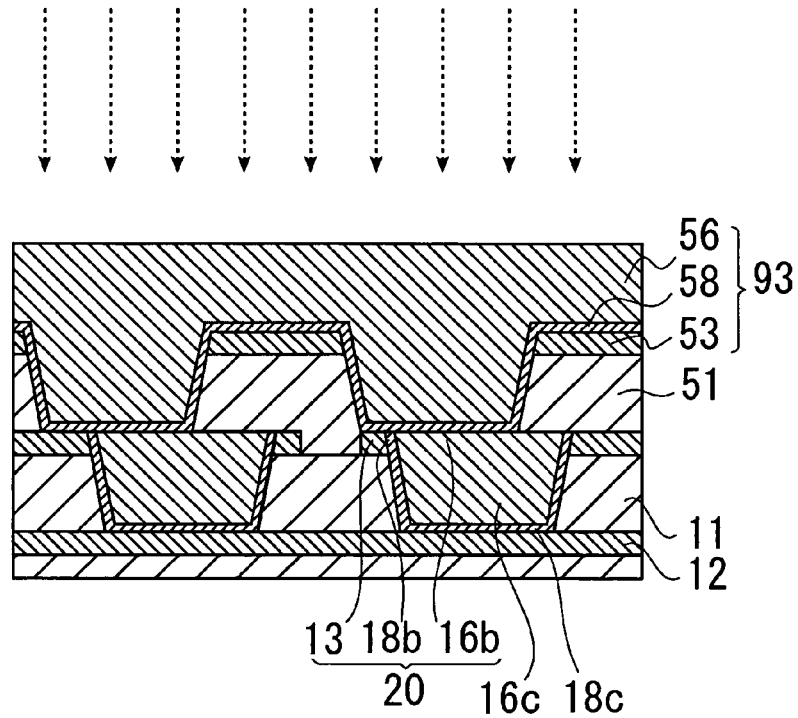
FIG. 25 is a ninth cross section for illustrating the method of manufacturing the double-layered flexible wiring board according to one embodiment of the present invention.

Next, as shown in FIG. 25, an etchant is sprayed from a shower nozzle (not shown) onto the surface of the second coating conductive layer 93. As a result, the surface of the second coating conductive layer 93 is etched to have a reduced thickness. When the second conductive material 56 provided on the surface of the second surface conductive layer 53 is completely removed, the etching is terminated. Herein, the second conductive material 56 and the second electroless plating layer 58 provided on the surface of the second surface conductive layer are removed in this embodiment.

Figure 26A:
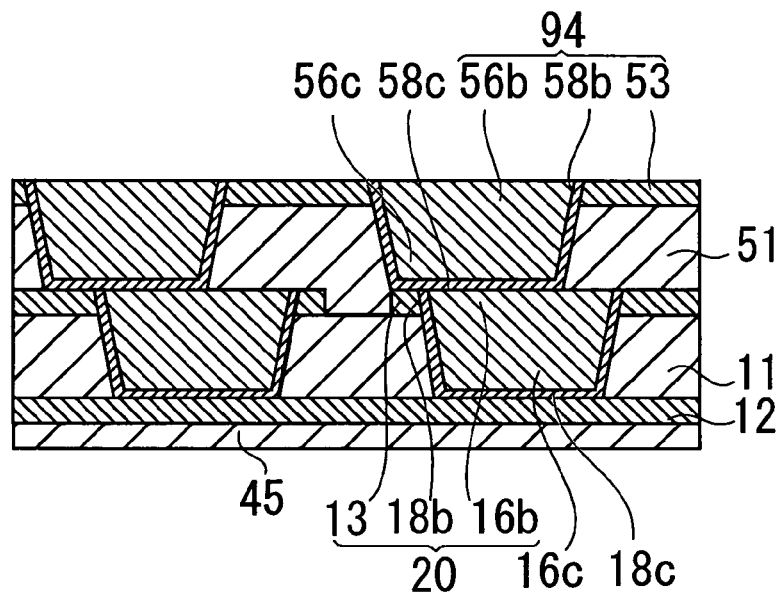
FIG. 26A is a tenth cross section for illustrating the method of manufacturing the double-layered flexible wiring board according to one embodiment of the present invention, and FIG. 26B an eleventh cross section for illustrating the method of manufacturing the double-layered flexible wiring board according to one embodiment of the present invention.

As a result of such etching, the second conductive material 56 and the second electroless plating layer 58 remain in the second via hole 55, whereas the second surface conductive layer 53 remains on the surface of the second base film 51, as shown in FIG. 26A. A part of the remaining second conductive material 56 and a part of the remaining electroless plating layer 58, which are situated above the surface of the second base film 51, are denoted by reference numeral 58b and 56b. The electroless plating layer 58b and the second conductive material 56b comprise a second conductive layer 94 according to the present invention together with the second surface conductive layer 53. The second conductive layer 94 in FIG. 26B is connected to the first wiring layer 20 through a second conductive material 56c and a second electroless plating layer 56c that are placed on the bottom of the second via hole 55.

Figure 26B:
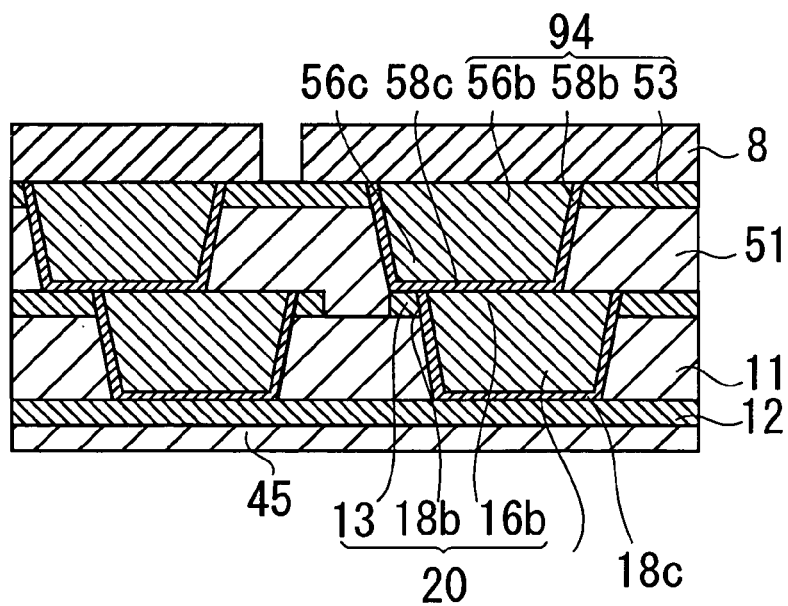

Next, as shown in FIG. 26B, after application of a resist onto the surface of the second conductive layer 94, the resist is patterned into a desired pattern so as to form a resist film 8.

Figure 27:
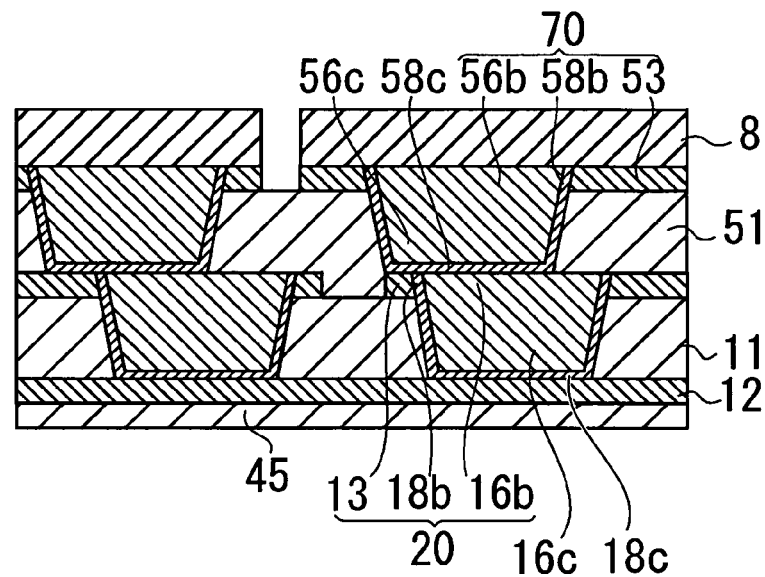
FIG. 27 is a twelfth cross section for illustrating the method of manufacturing the double-layered flexible wiring board according to one embodiment of the present invention.

Next, as shown in FIG. 27, the second conductive layer 94 is etched away by wet etching, using the resist film 8 as a mask. Then, the second conductive layer 94 is patterned into the same pattern as that of the resist film 8. As a result, a second wiring layer 70 composed of the second surface conductive layer 53, the second electroless plating layer 58b, and the second conductive material 56b is formed. The second electroless plating layer 58b and the second conductive material 56b are parts of the second electroless plating layer 58 and the second conductive material 56 which are situated above the surface of the second base film 51.

As in the case where the first wiring layer 20 is formed, it is only the thin second surface conductive layer 53 that is etched away at the time of patterning. Therefore, in the case where the patterning is treated with isotropic etching such as wet etching, a pattern width of the second wiring layer 70 which is formed as a result of patterning is substantially identical with a pattern width of the resist film 8.

Figure 28:
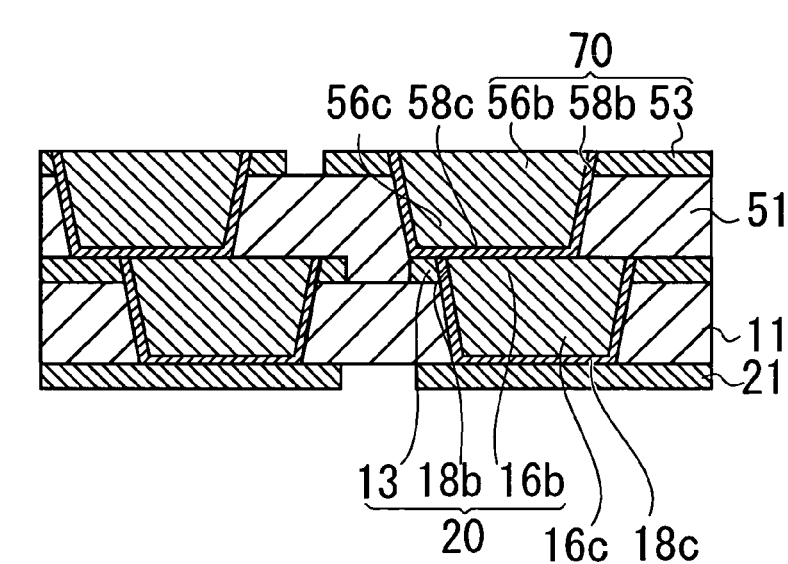
FIG. 28 is a thirteenth cross section for illustrating the method of manufacturing the double-layered flexible wiring board according to one embodiment of the present invention.

Thereafter, the resist film 8 is stripped off. Then, after the carrier film 45 is stripped off, the reference conductive layer 12 is patterned to form a reference wiring layer 21 as shown in FIG. 28. As a result, a double-layered flexible wiring substrate 2 is completed.

As mentioned above, in the case where the double-layered flexible wiring substrate 2 is manufactured in this manner, the first and second coating conductive layers 91 and 93 are etched to be thinned. After the first and second conductive layers 92 and 94 respectively comprised the first and second surface conductive layers 13 and 53 are formed, the thin first and second conductive layers 92 and 94 are patterned so as to form the first and second wiring layers 20 and 70, respectively. Therefore, the patterns of the first and second wiring layers 20 and 70 are substantially the same as those of the resist films 7 and 8 serving as masks upon etching. Accordingly, the pattern width does not become narrower than a desired width, as otherwise happens in a conventional case. Moreover, with reduced thicknesses of the first and second wiring layers 20 and 70, a thickness of the entire flexible wiring substrate 2 is also reduced, whereby the flexible wiring substrate 2 becomes light-weighted.

Although the double-layered flexible wiring board has been described above, a multi-layered flexible wiring board composed of three or more layers may also be manufactured by sequentially building up layers on the surface of the first base film 11 in the same manner as the above-described manufacturing method.

Moreover, although the case where a multi-layered flexible wiring board is manufactured by sequentially building up layers on one side of the first base film 11 has been described in the above-described embodiment, the present invention is not limited thereto. A multi-layered flexible wiring board may also be manufactured by building up layers on both surfaces of the first base film 11.

One example of such a manufacturing process will be described with reference to FIGS. 29 to 34.

Figure 29:
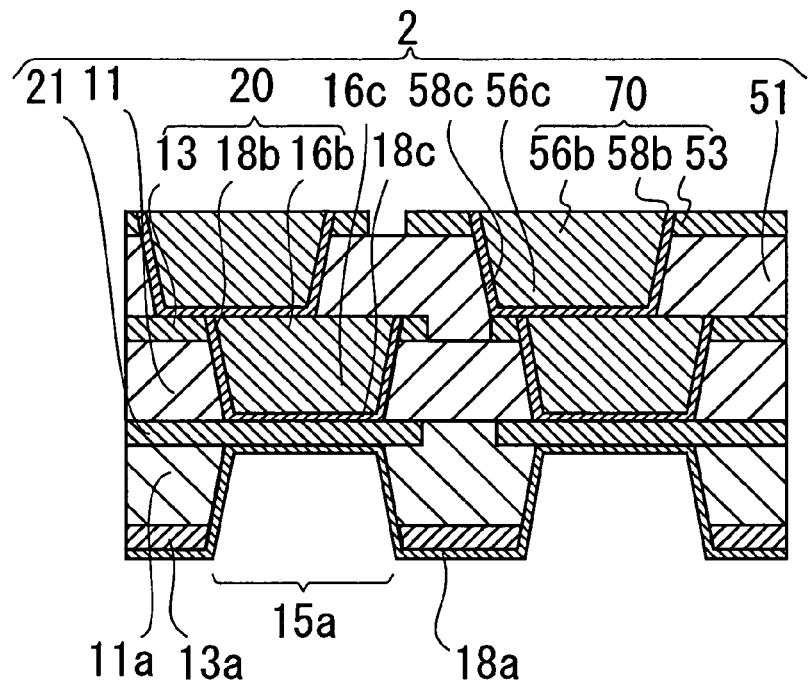
FIG. 29 is a first cross section for illustrating a method of manufacturing a multi-layered flexible wiring board according to another embodiment of the present invention.

First, a polyimide precursor solution is applied on the back face of the first base film 11 and on the surface of the reference wiring layer 21 of the double-layered flexible wiring substrate 2 shown in FIG. 28. Then, the polyimide precursor solution is semi-cured so as to form a third base film 11a as shown in FIG. 29. After a copper foil is adhered onto a surface of the third base film 11a to form a first back-face conductive layer 13a, the surface of the first back-face conductive layer 13a is irradiated with laser light so as to form a third via hole 15a penetrating the first back-face conductive layer 13a and the third base film 11a to reach the reference wiring layer 21 at its bottom. This third via hole 15a is an example of a third hole of the present invention. Subsequently, a third electroless plating layer 18a is formed over an inner face of the third via hole 15a and the surface of the first back-face conductive layer 13a by electroless plating.

Figure 30:
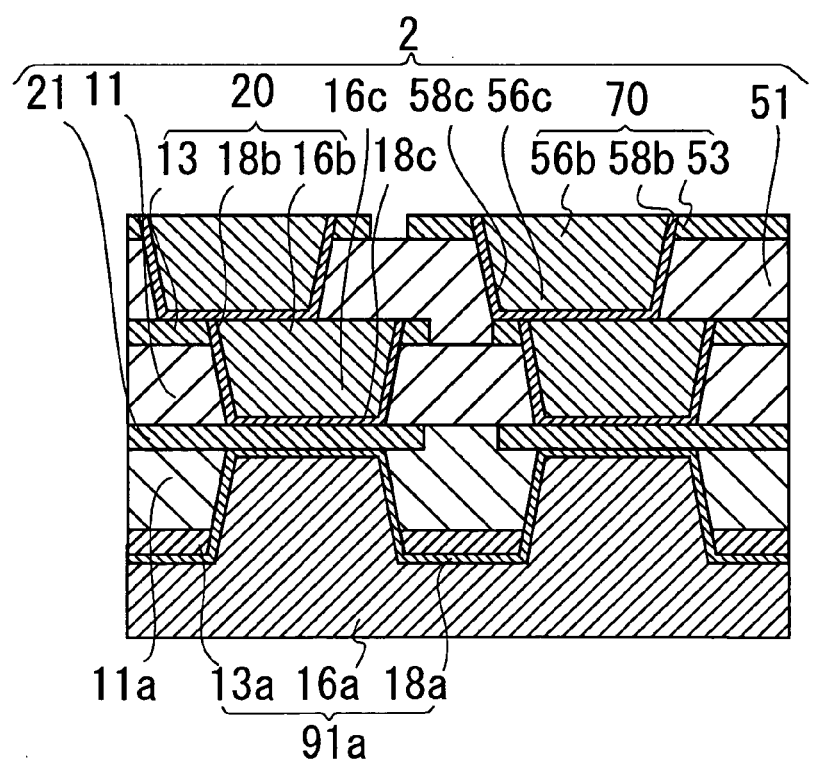
FIG. 30 is a second cross section for illustrating the method of manufacturing the multi-layered flexible wiring board according to another embodiment of the present invention.

Next, as shown in FIG. 30, a third conductive material 16a is grown on a surface of the third electroless plating layer 18a by electrolytic plating using career film. The thus grown third conductive material 16a, the third electroless plating layer 18a and the first back-face conductive layer 13a comprise a third coating conductive layer of the present invention. Reference numeral 91a in the drawings denotes the third coating conductive layer.

Figure 31:
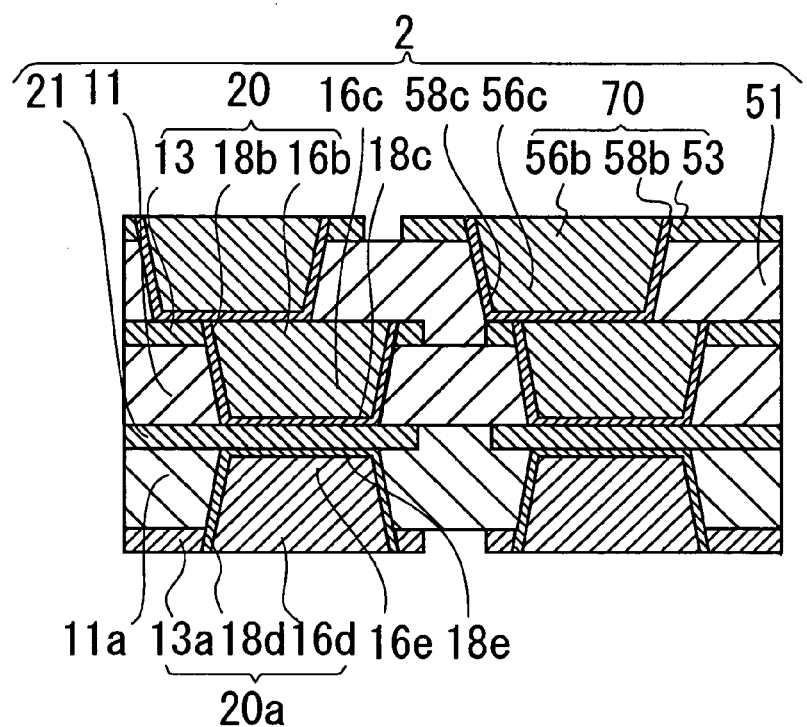
FIG. 31 is a third cross section for illustrating the method of manufacturing the multi-layered flexible wiring board according to another embodiment of the present invention.

Subsequently, as shown in FIG. 31, the third coating conducive layer 91a is etched so as to be thinned until both the third electroless plating layer 18a and the third conductive material 16a provided on the surface of the first back-face conductive layer 13a are completely removed. After formation of a third conductive layer comprised the first back-face conductive layer 13a, the third conductive layer is patterned so as to form a third wiring layer 20a. The third wiring layer 20a comprised the first back-face conductive layer 13a, a third electroless plating layer 18d and a third conductive material 16d. The third electroless plating layer 18d and the third conductive material 16d are situated above the surface of the third base film 11a. A part of the third conductive material and a part of the third electroless plating layer situated in the vicinity of the bottom of the third via hole 15a are denoted by reference numerals 16e and 18e in FIG. 31, respectively. The third wiring layer 20a is connected to the reference wiring layer 21 through the third conductive material 16e and the third electroless plating layer 18e which are situated in the vicinity of the bottom of the third via hole 15a. Through the steps so far, a three-layered flexible wiring board, in which a single-layered flexible wiring board is laminated on the back side of the double-layered flexible wiring board, is formed.

Figure 32:
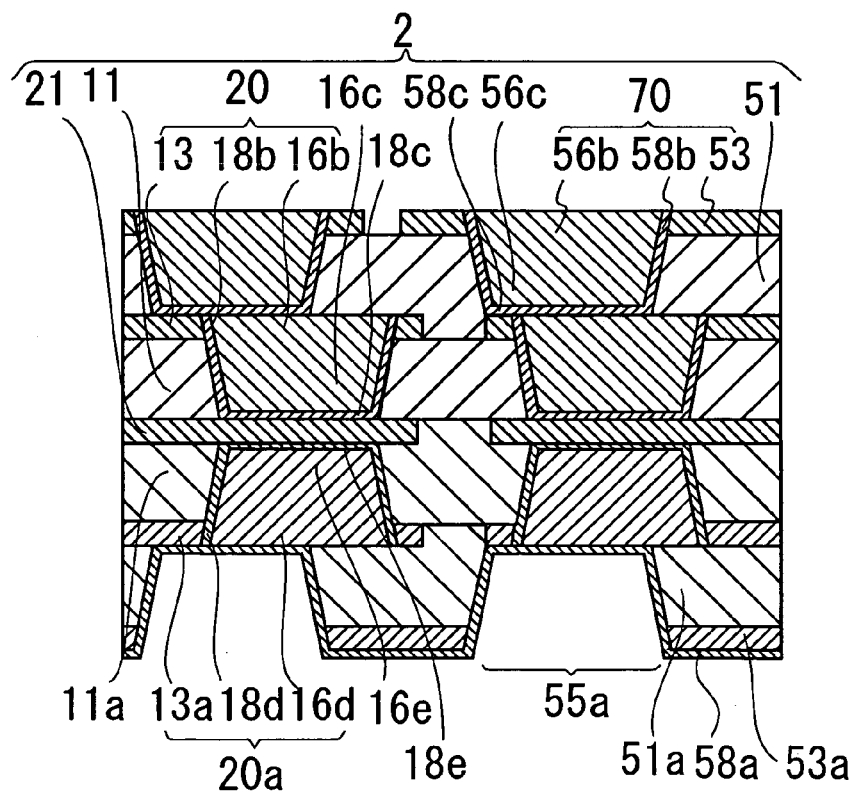
FIG. 32 is a fourth cross section for illustrating the method of manufacturing the multi-layered flexible wiring board according to another embodiment of the present invention.

Next, as shown in FIG. 32, a polyimide precursor solution is applied onto the surfaces of the third base film 11a and the third wiring layer 20a. The polyimide precursor solution is semi-cured to form a fourth base film 51a. After a copper foil is adhered onto a surface of the fourth base film 51a to form a second back-face conductive layer 53a, the surface of the second back-face conductive layer 53a is irradiated with laser light so as to form a fourth via hole 55a penetrating the second back-face conductive layer 53a and the fourth base film 51a to reach a surface of the third wiring layer 20a at its bottom. Then, a fourth electroless plating layer 58a is formed over an inner face of the fourth via hole 55a and a surface of the second back-face conductive layer 53a.

Figure 33:
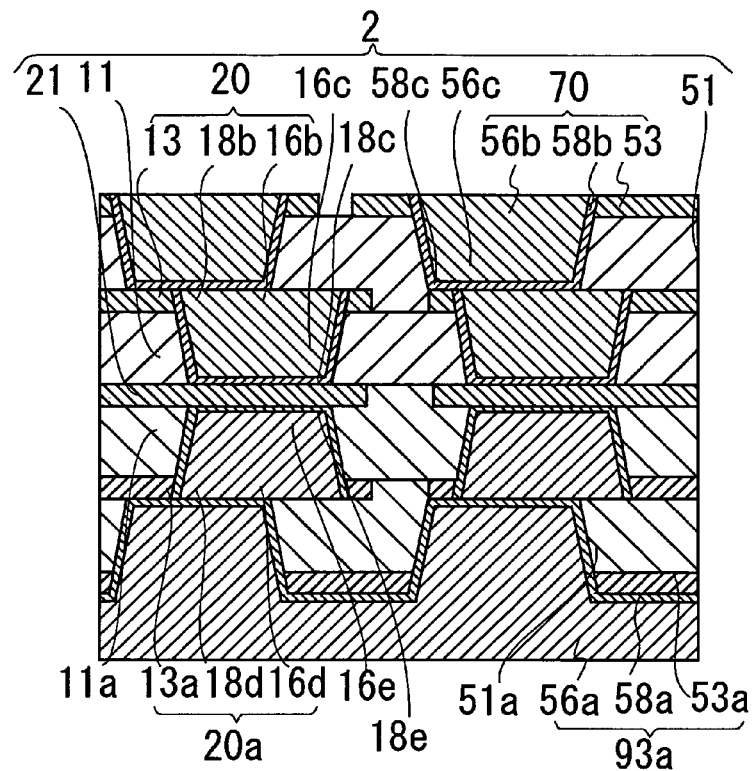
FIG. 33 is a fifth cross section for illustrating the method of manufacturing the multi-layered flexible wiring board according to another embodiment of the present invention.

Next, as shown in FIG. 33, a fourth conductive material 56a is grown on a surface of the fourth electroless plating layer 58a by electrolytic plating. The thus grown fourth conductive material 56a, the fourth electroless plating layer 58a and the second back-face conductive layer 53a comprise a fourth coating conductive layer of the present invention. Reference numeral 93a in the drawings denotes the fourth coating conductive layer.

Figure 34:
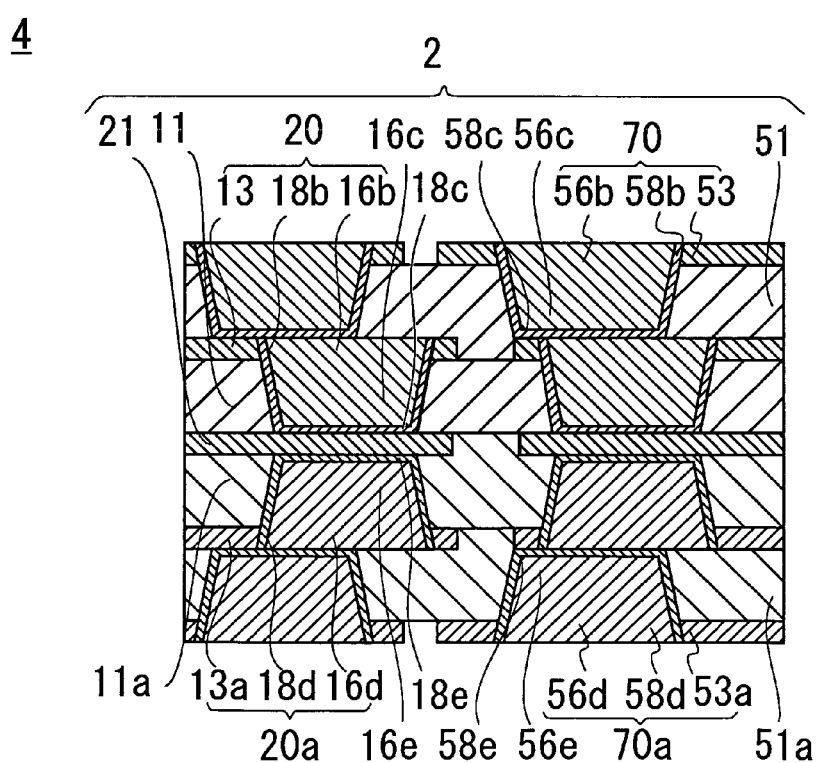
FIG. 34 is a cross section for illustrating a method of manufacturing a multi-layered flexible wiring board according to a further embodiment of the present invention.

Subsequently, the fourth coating conducive layer 93a is etched so as to be thinned until the fourth electroless plating layer 58a provided on the surface of the second back-face conductive layer 53a and the fourth conductive material 56a are completely removed. In this manner, a fourth conductive layer composed of the second back-face conductive layer 53a is formed. Thereafter, the fourth conductive layer is patterned so as to form a fourth wiring layer 70a as shown in FIG. 34. The fourth wiring layer 70a comprise the second back-face conductive layer 53a, a fourth electroless plating layer 58d and a fourth conductive material 56d which are part of the fourth electroless plating layer 58 and the fourth conductive material 56 situated above the surface of the fourth base film 51a. A part of the fourth conductive material and a fourth intermediate conductive material placed in the vicinity of the bottom of the fourth via hole 55a are denoted by reference numerals 56e and 58e in the drawings, respectively. The fourth wiring layer 70a is connected to the third wiring layer 20a through the fourth conductive material 56e and the fourth electroless plating layer 58e which are situated in the vicinity of the bottom of the fourth via hole 55a. Through the steps described above, a four-layered flexible wiring board 4 in which a double-layered flexible wiring board is laminated on the back face side of another double-layered flexible wiring board 2, is formed.

In the above-described embodiments, the four-layered flexible wiring board in which the double-layered flexible wiring board is laminated on the back face side of the double-layered flexible wiring board 2, has been fabricated. However, the present invention is not limited thereto. Any structure may be possible as long as a multi-layered flexible wiring board is deposited on the back side of another multi-layered flexible wiring board; for example, a three-layered flexible wiring board may be laminated on the back face of a five-layered flexible wiring board.

In any of the above-described embodiments, the first and second via holes 15 and 55 are filled with the first and second electroless plating layers 18 and 58 and the first and second conductive materials 16a and 56a, respectively. However, the present invention is not limited thereto. An example thereof will be described below.

Figure 35:
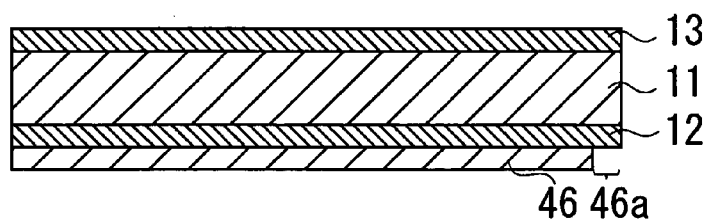
FIG. 35 is a first cross section for illustrating a method of manufacturing a flexible wiring board according to a further embodiment of the present invention.

First, after the first surface conductive layer 13 and the reference conductive layer 12 are formed on the surface and the bottom face of the first base film 11, respectively, through the steps shown in FIGS. 1 to 3, a carrier film 46 is formed on the surface of the reference conductive layer 12. An opening 46a is formed on a part of the carrier film 46 so as to expose the reference conductive layer 12 through the opening 46a. This state is shown in FIG. 35.

Figure 36:
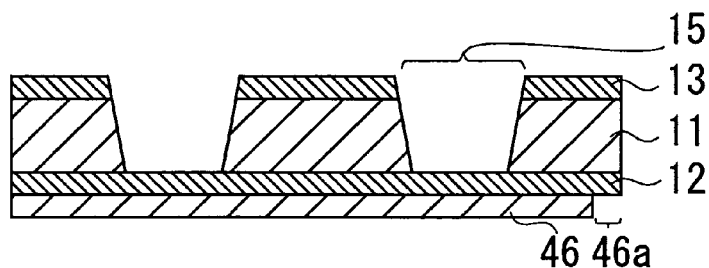
FIG. 36 is a second cross section for illustrating the method of manufacturing the flexible wiring board according to the further embodiment of the present invention.

Next, similarly to the step illustrated in FIG. 4, the surface of the first surface conductive layer 13 is irradiated with laser light at a predetermined position for a plurality of times so as to form a first via hole penetrating the first surface conductive layer 13 and the first base film 11 to reach the reference conductive layer 12 at its bottom. This state is shown in FIG. 36, and the thus formed first via hole is denoted by reference numeral 15, whose diameter is about 50 μm, and whose depth is about 35 μm.

Figure 37:
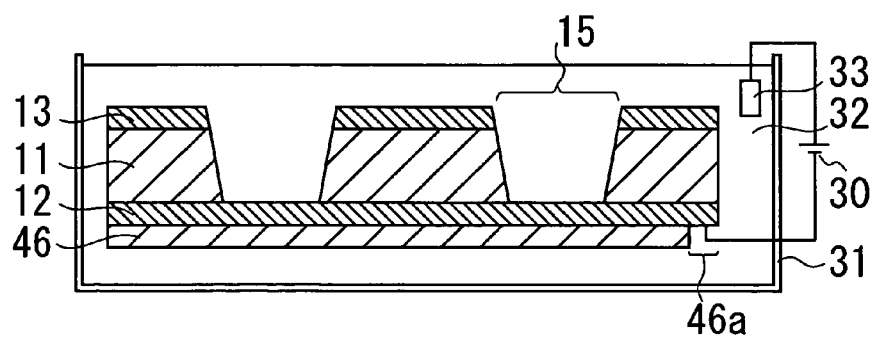
FIG. 37 is a third cross section for illustrating the method of manufacturing the flexible wiring board according to the further embodiment of the present invention.

Next, as shown in FIG. 37, a negative pole and a positive pole of the DC power source 30 are connected to the reference conductive layer 12 that is exposed through the opening 46a and the electrode 33, respectively. The first base film 11 and the electrode 33 are immersed into the electrolytic plating solution 32 containing copper in the container 31.

Figure 38:
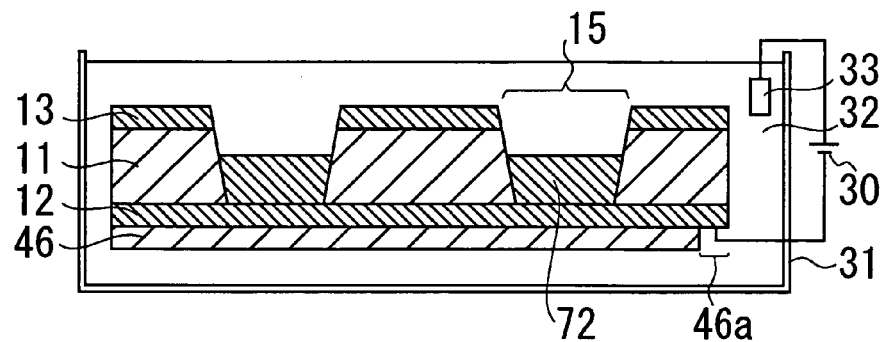
FIG. 38 is a fourth cross section for illustrating the method of manufacturing the flexible wiring board according to the further embodiment of the present invention.

Next, as shown in FIG. 38, the DC power source 30 is activated to apply a DC voltage between the electrolytic plating solution 32 and the reference conductive layer 12 so as to electrolyze the electrolytic plating solution 32. As a result, a first bottom-side conductive material 72 made of copper starts to grow on the surface of the reference conductive layer 12 that is exposed on the bottom of the first via hole 15. At this moment, since the first surface conductive layer 13 is not in contact with the reference conductive layer 12, no voltage is applied thereto. Therefore, the first bottom-side conductive material 72 is not grown on the surface of the first surface conductive layer 13.

Figure 39:
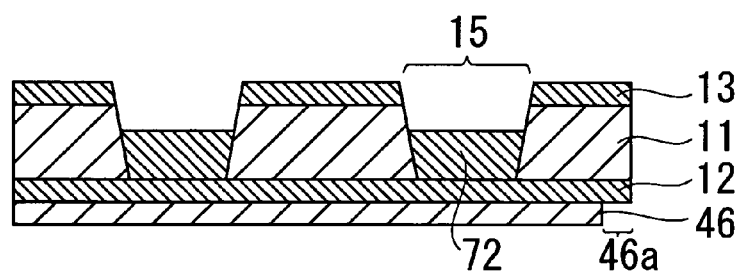
FIG. 39 is a fifth cross section for illustrating the method of manufacturing the flexible wiring board according to the further embodiment of the present invention.
Figure 40:
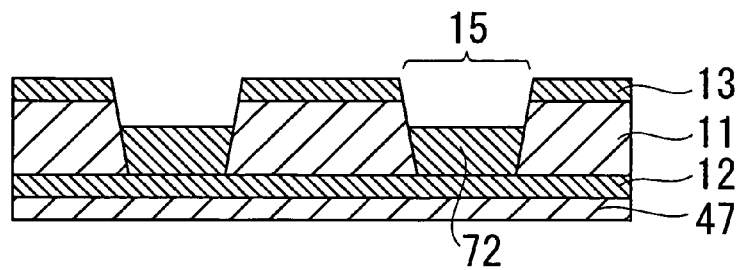
FIG. 40 is a sixth cross section for illustrating the method of manufacturing the flexible wiring board according to the further embodiment of the present invention.

When the first bottom-side conductive material 72 is grown to such a depth that the first bottom-side conductive material 72 is not in contact with the first surface conductive layer 13, the application of a DC voltage is stopped to terminate the growth. In this case, when the first bottom-side conductive material 72 is grown from the surface of the reference conductive layer 12 that is exposed on the bottom of the first via hole 15 to a thickness of 15 μm, the growth is terminated. Subsequently, after the first base film 11 is taken out of the electrolytic plating solution 32, the first base film 11 is cleaned. This state is shown in FIG. 39. Next, after the carrier film 46 is stripped off as shown in FIG. 40, another carrier film 47 made of PET is provided onto the surface of the reference conductive layer 12. In this state, the surface of the reference conductive layer 12 is completely covered with the carrier film 47.

Figure 41:
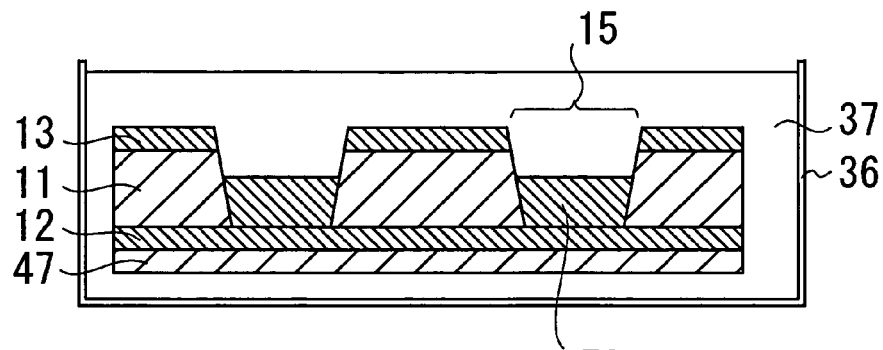
FIG. 41 is a seventh cross section for illustrating the method of manufacturing the flexible wiring board according to the further embodiment of the present invention.

Next, as shown in FIG. 41, the above-described first base film 11 is immersed into the electroless plating solution 37 in the container 36.

Figure 42:
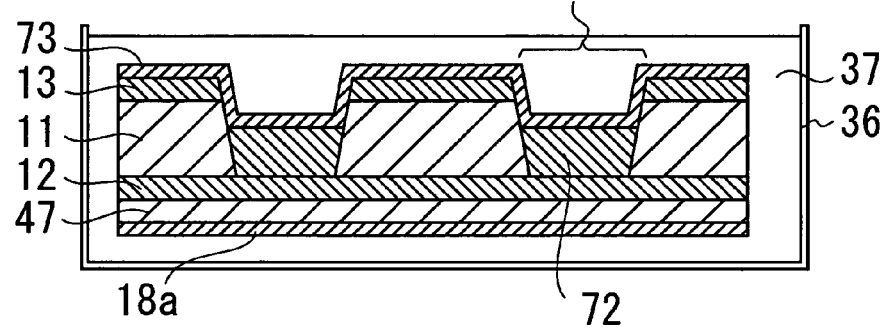
FIG. 42 is an eighth cross section for illustrating the method of manufacturing the flexible wiring board according to the further embodiment of the present invention.

As a result, as shown in FIG. 42, a first intermediate conductive material 73 made of copper is grown from a surface of the first surface conductive layer 13 over a surface of the first base film 11 which is exposed on the inner side face of the first via hole 15 and the surface of the first bottom-side conductive material 72.

Figure 43:
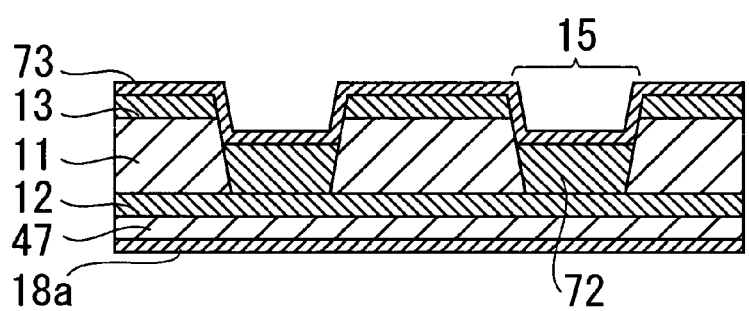
FIG. 43 is a ninth cross section for illustrating the method of manufacturing the flexible wiring board according to the further embodiment of the present invention.

When the grown first intermediate conductive material 73 acquires a sufficient thickness (in this case, 5 μm) to allow the connection between the surface of the first surface conductive layer 13 and the first bottom-side conductive material 72, the first base film 11 is taken out of the electroless plating solution 37 to terminate the growth. The state where the growth is terminated is shown in FIG. 43. In this case, when a thickness of the first intermediate conductive material 73 reaches 15 μm, the growth is terminated. In this state, the surface of the first surface conductive layer 13, the first base film 11 that is exposed on the inner side face of the first via hole 15, and the first bottom-side conductive material 72, are completely covered with the first intermediate conductive material 73. On the other hand, since the entire surface of the reference conductive layer 12 is covered with the carrier film 47 as described above, the electroless plating layer is not grown on the surface of the reference conductive layer 12.

Figure 44:
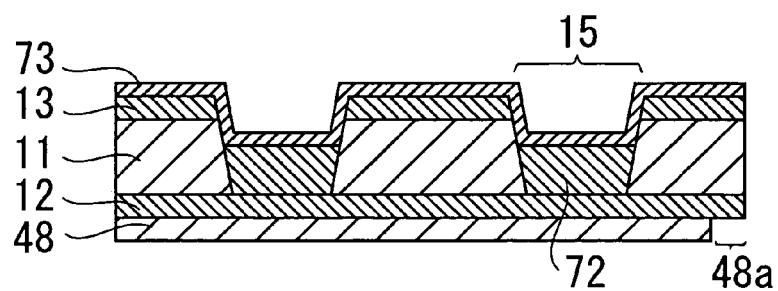
FIG. 44 is a tenth cross section for illustrating the method of manufacturing the flexible wiring board according to the further embodiment of the present invention.

Next, as shown in FIG. 44, after the carrier film 47 is stripped off, another carrier film 48 made of PET is provided onto the surface of the reference conductive layer 12. Thereafter, a part of the carrier film 48 is etched away to form an opening 48a so that the surface of the reference conductive layer 12 is exposed on the bottom of the opening 48a.

Figure 45:
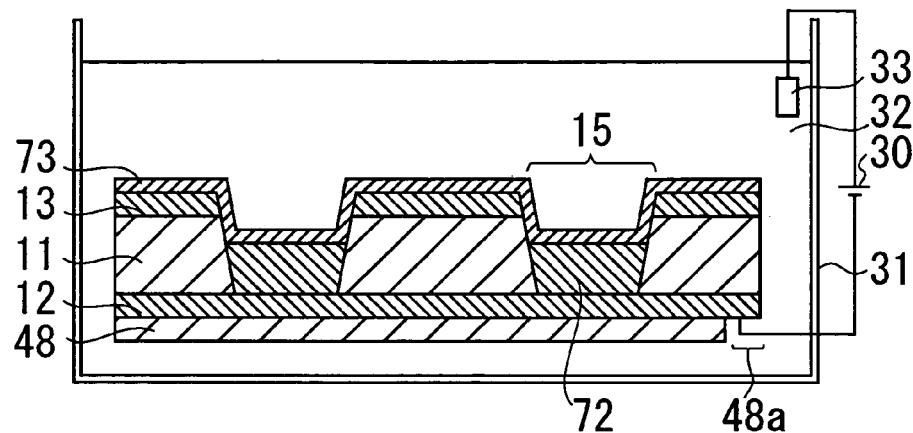
FIG. 45 is an eleventh cross section for illustrating the method of manufacturing the flexible wiring board according to the further embodiment of the present invention.

Next, as shown in FIG. 45, a negative pole and a positive pole of the DC power source 30 are connected to the reference conductive layer 12 that is exposed through the opening 48a and to the electrode 33, respectively. Then, the first base film 11 and the electrode 33 are immersed into the electrolytic plating solution 32 containing copper in the container 31. At this moment, since the first intermediate conductive material 73 is connected to the reference conductive layer 12 through the first bottom-side conductive material 72, the first intermediate conductive material 73 is connected to the negative pole of the DC power source 30.

Figure 46:
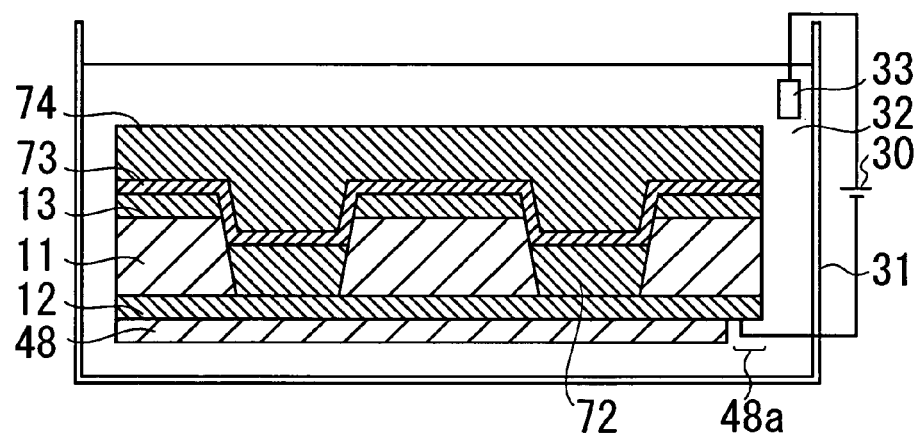
FIG. 46 is a twelfth cross section for illustrating the method of manufacturing the flexible wiring board according to the further embodiment of the present invention.
Figure 47:
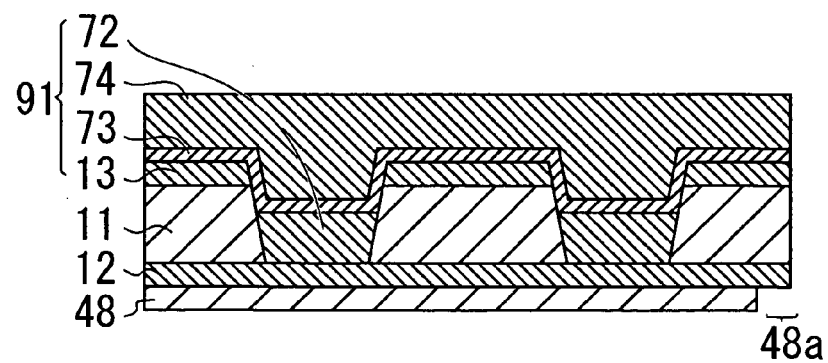
FIG. 47 is a thirteenth cross section for illustrating the method of manufacturing the flexible wiring board according to the further embodiment of the present invention.

Next, as shown in FIG. 46, when the DC power source 30 is activated to apply a DC voltage between the electrolytic plating solution 32 and the reference conductive layer 12, the electrolytic plating solution 32 is electrolyzed so that a first surface-side conductive material 74 made of copper is grown on the entire surface of the first intermediate conductive material 73 that is connected to the negative pole. When the first via hole 15 is completely filled with the first surface-side conductive material 74 so as to provide a flat surface for the first surface-side conductive material 74, the application of a DC voltage is stopped to terminate the growth. In this case, when the first surface-side conductive material 74 is grown to a thickness of 50 μm from the surface of the first surface conductive layer 13, the growth is terminated. As a result, as shown in FIG. 47, a first coating conductive layer 91 comprised the grown first surface-side conductive material 74, the first intermediate conductive material 73, the first bottom-side conductive material 72 and the first surface conductive layer 13 is formed on the first base film 11.

A large portion of the first via hole 15 is filled with the first bottom-side conductive material 72 and the first intermediate conductive material 73, and has an extremely small depth. Therefore, even if the first via hole 15 has a high aspect ratio in the state where no first bottom-side conductive material 72 is present, an aspect ratio of the first via hole 15 is reduced after filling the first bottom-side conductive material 72. Thus, the first via hole 15 is completely filled with the first surface-side conductive material 74, whereby no void is generated.

Figure 48:
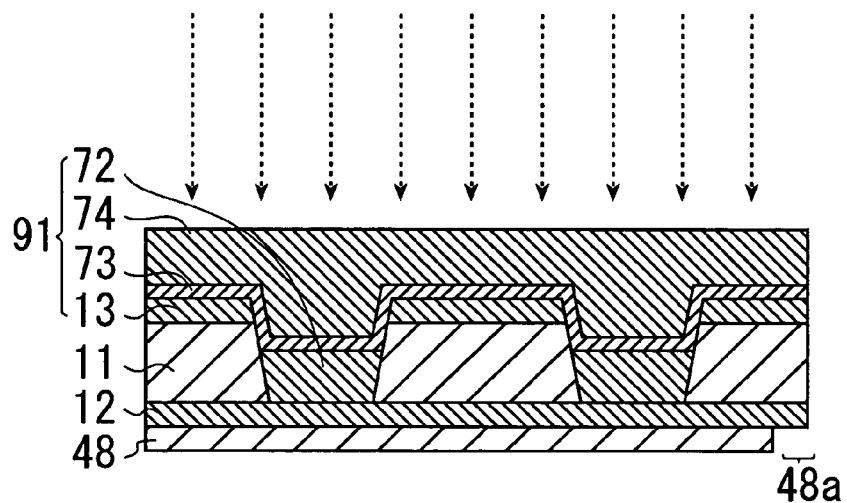
FIG. 48 is a fourteenth cross section for illustrating the method of manufacturing the flexible wiring board according to the further embodiment of the present invention.
Figure 49:
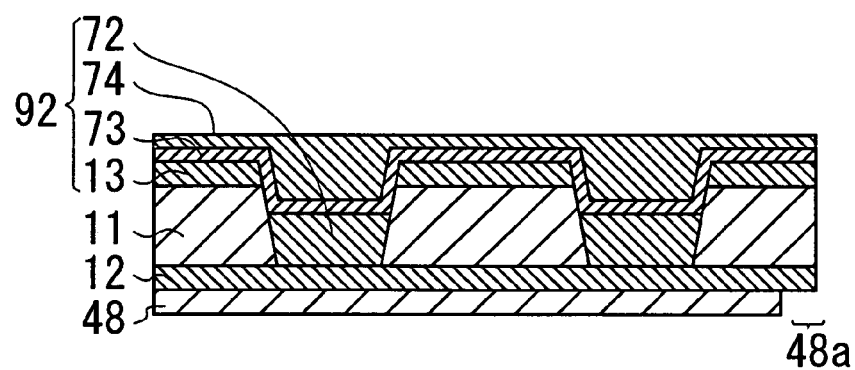
FIG. 49 is a fifteenth cross section for illustrating the method of manufacturing the flexible wiring board according to the further embodiment of the present invention.

Next, as shown in FIG. 48, an etchant is sprayed from a shower nozzle (not shown) onto the surface of the first coating conductive layer 91. As a result, the first coating conductive layer 91 is etched. When the first coating conductive layer 91 is etched to thin the first surface-side conductive layer 74 positioned at the uppermost layer in the first coating conductive layer 91 to a predetermined thickness, the etching is terminated. The state where the etching is terminated is shown in FIG. 49. In this case, when a thickness of the first surface-side conductive layer 74 grown in a region on the first surface conductive layer 13 is reduced to 5 μm, the etching is terminated. As a result, as shown in FIG. 49, a first conductive layer 92 according to the present invention is formed. This first conductive layer 92 is composed of three layers, that is, the first surface conductive layer 13, the first intermediate conductive material 73, and the first surface-side conductive material 74 in a region where the first surface conductive layer 13 is provided, whereas the first conductive layer 92 is composed of three layers, that is, the first bottom-side conductive material 72 and the first intermediate conductive material 73, which are situated above the surface of the first base film, and the first surface-side conductive material 74, in a region where the first surface conductive layer 13 is not provided.

Figure 50A:
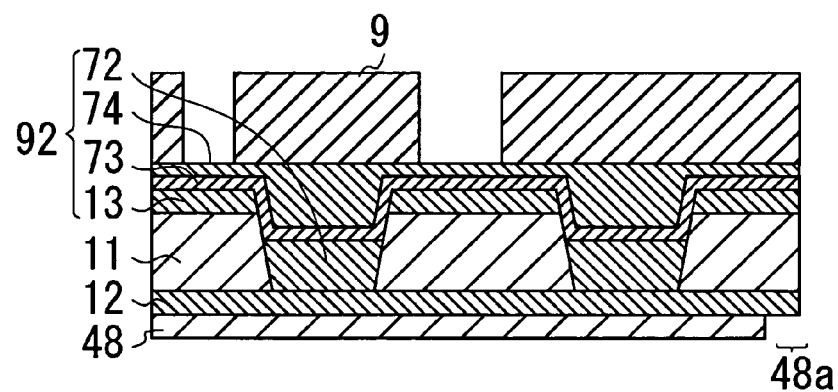
FIG. 50A is a sixteenth cross section for illustrating the method of manufacturing the flexible wiring board according to the further embodiment of the present invention.
Figure 50B:
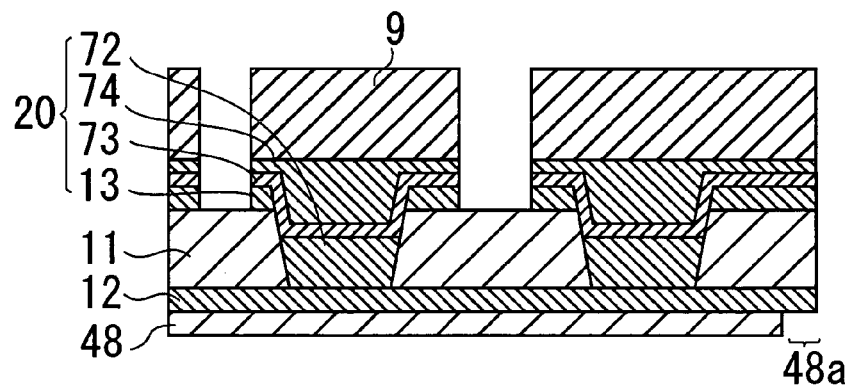
FIG. 50B is a seventeenth cross section for illustrating the method of manufacturing the flexible wiring board according to the further embodiment of the present invention.

Next, after application of a resist, the resist is patterned into a desired pattern so as to form a resist film 9 on the surface of the first conductive layer 92, as shown in FIG. 50A. Thereafter, as shown in FIG. 50B, the first conductive layer 92 is etched using the resist film 9 as a mask. As a result, the first wiring layer 20 is formed. The first wiring layer 20 comprised a part of three layers, i.e., the first bottom-side conductive material 72, the first intermediate conductive material 73, and the first surface-side conductive material 74, which is situated above the surface of the first base film 11, in a region where the first via hole 15 is formed. On the other hand, the first wiring layer 20 is composed of three layers, i.e., the first surface conductive layer 13, the first intermediate conductive material 73 and the first surface-side conductive material 74, on the surface of the first base film 11 where the first via hole 15 is not formed.

At this time, a thickness of the first surface-side conductive material 74 is reduced by etching. Moreover, the total thickness of three layers, i.e., the first bottom-side conductive material 72, the first intermediate conductive material 73, and the first surface-side conductive material 74 is small. Even when isotropic etching such as wet etching is conducted, a pattern width of the resulting first wiring layer 20 is not reduced, so that a pattern of the first wiring layer 20 is substantially identical with that of the resist film 9 as shown in FIG. 50B.

Figure 51:
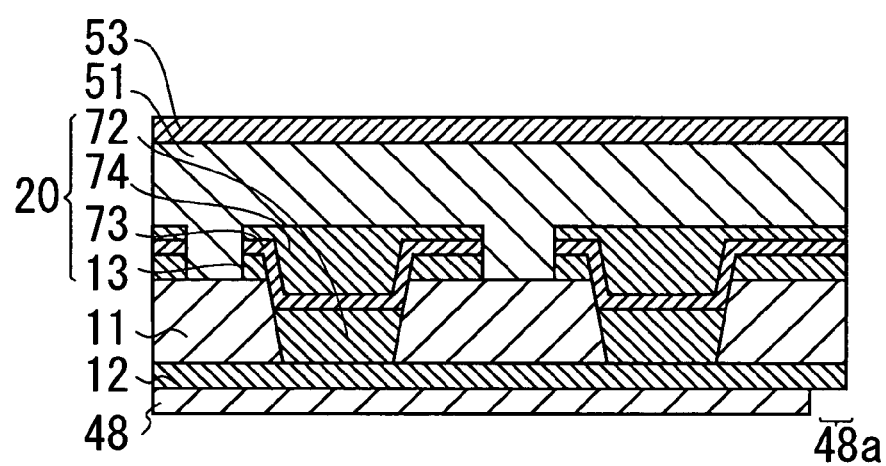
FIG. 51 is an eighteenth cross section for illustrating the method of manufacturing the flexible wiring board according to the further embodiment of the present invention.

Subsequently, a polyimide precursor solution is applied onto the surfaces of the first base film 11 and the first wiring layer 20. After the polyimide precursor solution is semi-cured to form a second base film, a metal foil is placed on a surface of the second base film. The metal foil is heated while being pressed against the second base film so as to adhere the metal foil and the second base film to each other. This state is shown in FIG. 51. In FIG. 51, reference numeral 51 denotes the second base film, and the reference numeral 53 denotes the metal foil (hereinafter, referred to as a second surface conductive layer). In this state, the second base film 51 is sandwiched between the first surface-side conductive material 74 and the second surface conductive layer 53.

Figure 52:
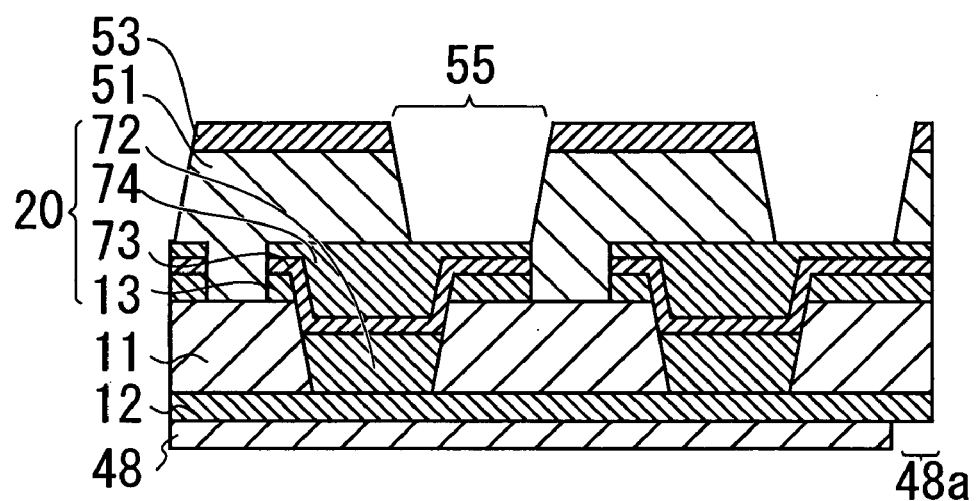
FIG. 52 is a nineteenth cross section for illustrating the method of manufacturing the flexible wiring board according to the further embodiment of the present invention.

Next, a surface of the second surface conductive layer 53 is irradiated with laser light at a predetermined position for a plurality of times to remove the second surface conductive layer 53 and the second base film 51 so as to form a second via hole 55 penetrating the second surface conductive layer 53 and the second base film 51 to reach the surface of the first surface-side conductive material 74 at its bottom, as shown in FIG. 52.

Figure 53:
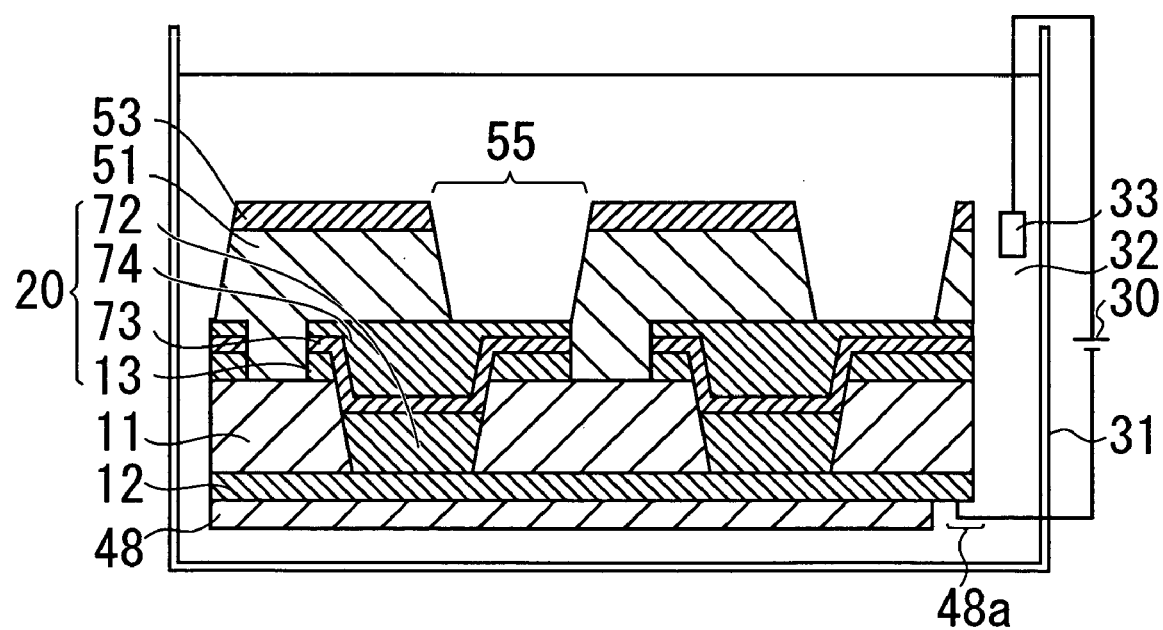
FIG. 53 is a twentieth cross section for illustrating the method of manufacturing the flexible wiring board according to the further embodiment of the present invention.
Figure 54:
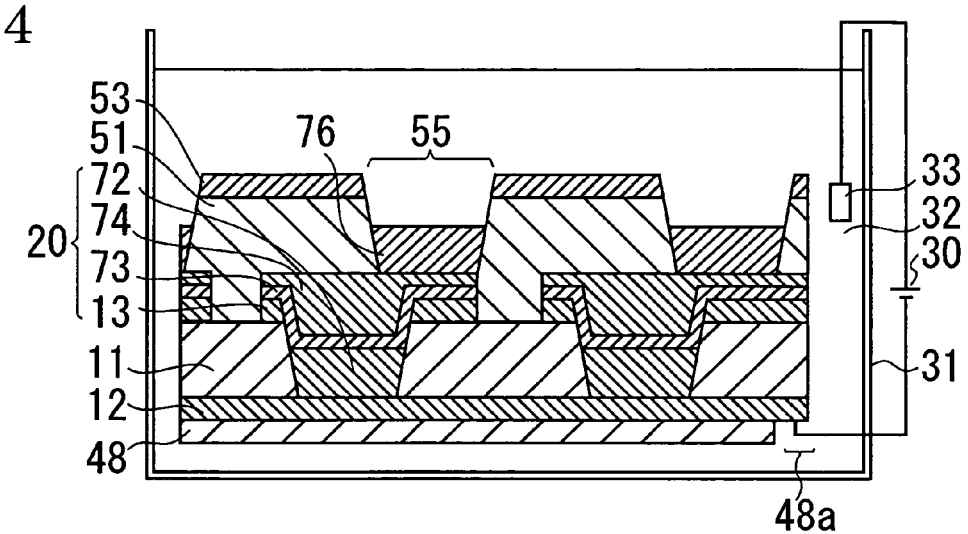
FIG. 54 is a twenty-first cross section for illustrating the method of manufacturing the flexible wiring board according to the further embodiment of the present invention.

Next, as shown in FIG. 53, a negative pole and a positive pole of the DC power source 30 are connected to the reference conductive layer 12 that is exposed through the opening 48a and to the electrode 33, respectively. The first base film 11 and the electrode 33 are immersed into the electrolytic plating solution 32 in the container 31. When the DC power source 30 is activated in this state to electrolyze the electrolytic plating solution 32, a second bottom-side conductive material 76 made of copper starts to grow on the surface of the first surface-side conductive material 74 that is exposed through the second via hole 55 as shown in FIG. 54. At this time, since the second surface conductive layer 53 is not in contact with the reference conductive layer 12 and the first surface-side conductive material 74, and no voltage is applied to the second surface conductive layer. Therefore, the second bottom-side conductive material 76 is not grown on the second surface conductive layer 53.

When the second bottom-side conductive material 76 is grown before it contacts the second surface conductive layer 53, the application of a DC voltage is stopped to terminate the growth.

Figure 55:
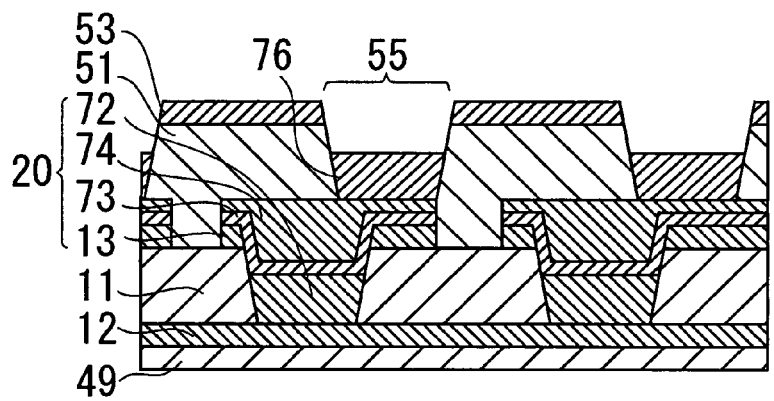
FIG. 55 is a twenty-second cross section for illustrating the method of manufacturing the flexible wiring board according to the further embodiment of the present invention.

Subsequently, after the first base film 11 is taken out of the electrolytic plating solution 32 and is then cleaned, the carrier film 48 is stripped off. Thereafter, another carrier film is provided onto the surface of the reference conductive layer 12. This state is shown in FIG. 55, where the newly provided carrier film is denoted by reference numeral 49. In this state, the surface of the reference conductive layer 12 is completely covered with the newly provided carried film 49.

Figure 56:
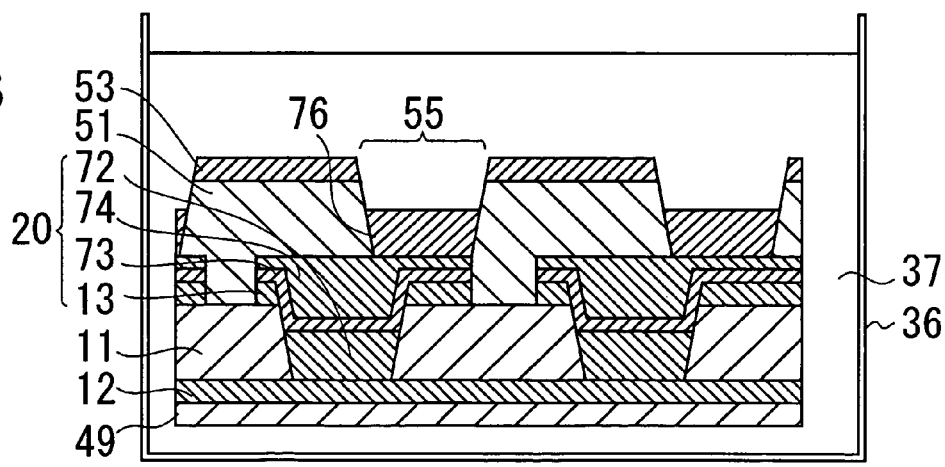
FIG. 56 is a twenty-third cross section for illustrating the method of manufacturing the flexible wiring board according to the further embodiment of the present invention.
Figure 57:
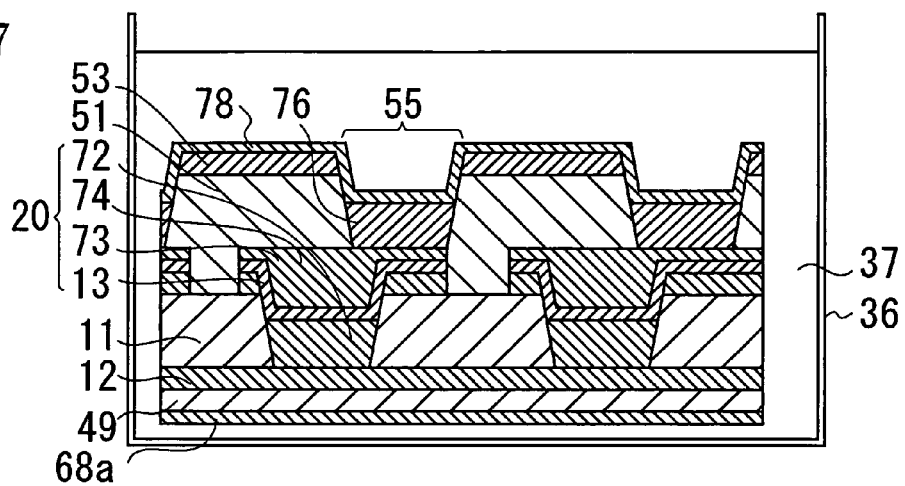
FIG. 57 is a twenty-fourth cross section for illustrating the method of manufacturing the flexible wiring board according to the further embodiment of the present invention.

Next, as shown in FIG. 56, the above-described first base film 11 is immersed into the electrolytic plating solution 37 in the container 36.

As a result, a second intermediate conductive material 78 made of copper is grown from the surface of the second bottom-side conductive material 76 over the surfaces of the second base film 51 and the seconds surface conductive layer 53 that are exposed on the inner side face of the second via hole 55. When the second intermediate conductive material 78 is grown so that the second bottom-side conductive material 76 and the second surface conductive layer 53 are connected to each other through the second intermediate conductive material 78, the first base film 11 is taken out of the electrolytic plating solution 37 so as to terminate the growth. In this case, when the thickness of the second intermediate conductive material 78 reaches 15 µm, the growth is terminated.

Figure 58:
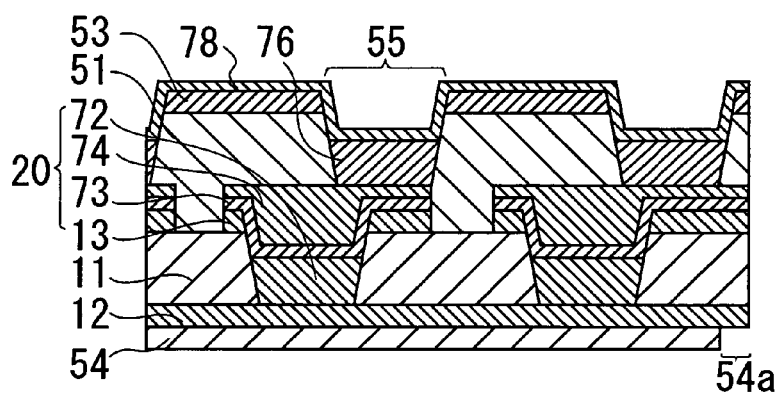
FIG. 58 is a twenty-fifth cross section for illustrating the method of manufacturing the flexible wiring board according to the further embodiment of the present invention.

Next, as shown in FIG. 58, after the carrier film 49 is stripped off from the reference conductive layer 12, another carrier film 54 is provided onto the surface of the reference conductive layer 12. Thereafter, a part of the new carrier film 54 is etched away to form an opening 54a through which the surface of the reference conductive layer 12 is exposed.

Figure 59:
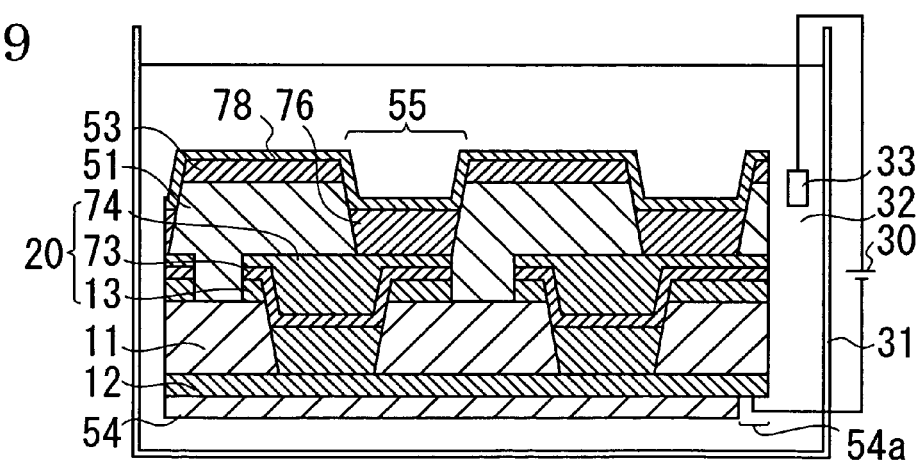
FIG. 59 is a twenty-sixth cross section for illustrating the method of manufacturing the flexible wiring board according to the further embodiment of the present invention.

Next, as shown in FIG. 59, a negative pole and a positive pole of the DC power source 30 are connected to the reference conductive layer 12 that is exposed through the opening 54a and to the electrode 33, respectively. Then, the first base film 11 and the electrode 33 are immersed into the electrode plating solution 32 in the container 31.

Figure 60:
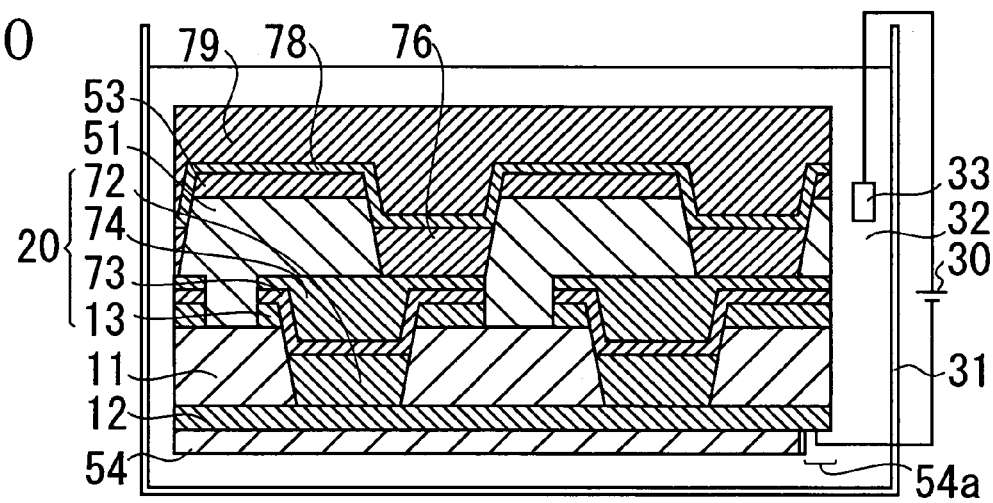
FIG. 60 is a twenty-seventh cross section for illustrating the method of manufacturing the flexible wiring board according to the further embodiment of the present invention.
Figure 61:
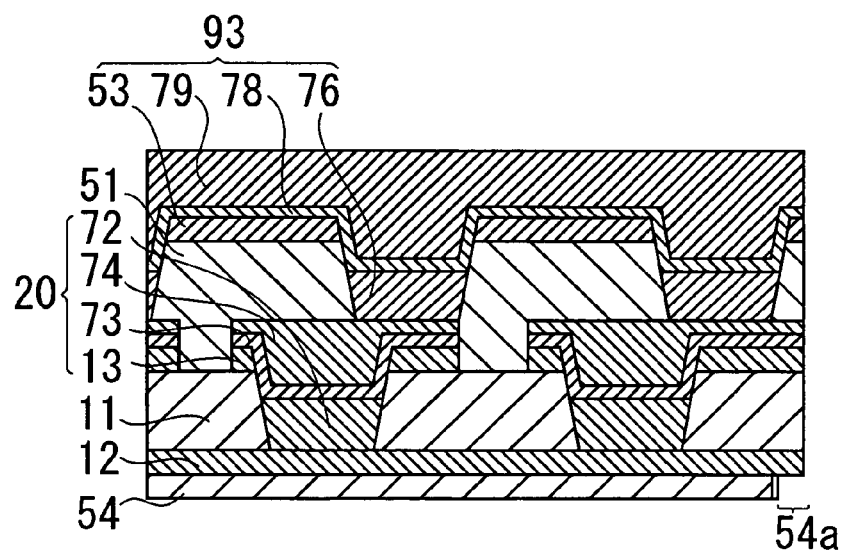
FIG. 61 is a twenty-eighth cross section for illustrating the method of manufacturing the flexible wiring board according to the further embodiment of the present invention.

Subsequently, as shown in FIG. 60, when the DC power source 30 is activated to apply a DC voltage between the electrolytic plating solution 32 and the reference conductive layer 12, a second surface-side conductive material 79 made of copper is grown over the entire surface of the second intermediate conductive material 78 that is connected to the negative pole through the first wiring layer 20 and the reference conductive layer 12. When the second surface-side conductive material 79 fills the second via hole 55 to provide a flat surface, the application of a DC voltage is stopped to terminate the growth. As a result, as shown in FIG. 61, a second coating conductive layer 93 comprised the second surface-side conductive material 79, the second intermediate conductive material 78, the second bottom-side conductive material 76, and the second surface conductive layer 53 is formed. In this case, the second via hole 55 is filled without any void, same as the first via hole 15.

Figure 62:
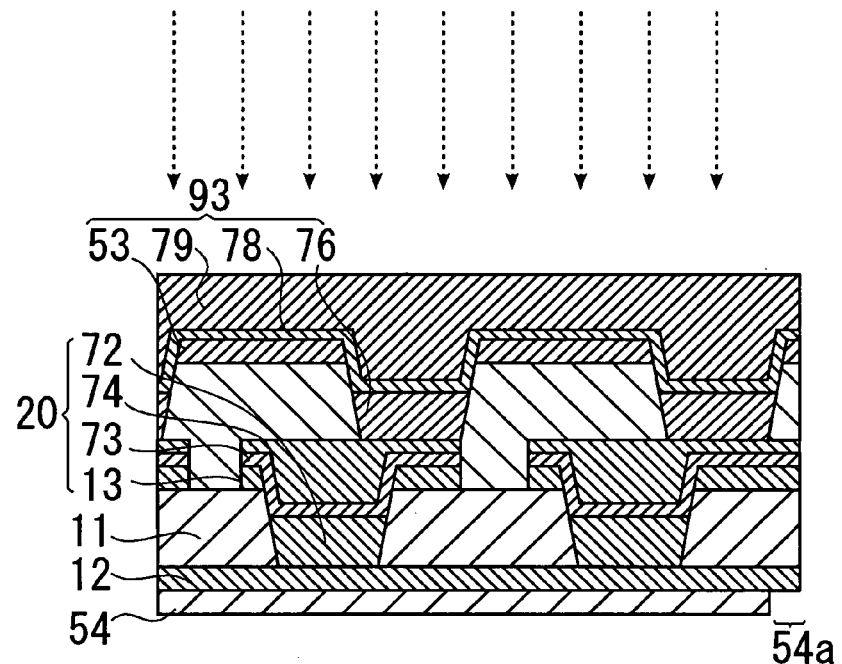
FIG. 62 is a twenty-ninth cross section for illustrating the method of manufacturing the flexible wiring board according to the further embodiment of the present invention.
Figure 63:
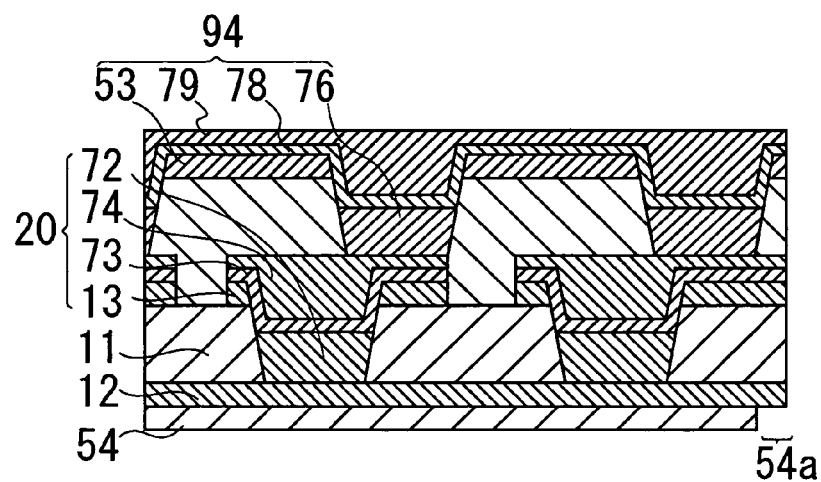
FIG. 63 is a thirtieth cross section for illustrating the method of manufacturing the flexible wiring board according to the further embodiment of the present invention.

Subsequently, as shown in FIG. 62, an etchant is sprayed onto a surface of the second surface-side conductive material 79 to thin the second surface-side conductive material 79 by etching. The etching is terminated before the second surface-side conductive material 79 is completely removed from the surface of the second intermediate conductive material 78 at the position where the second surface conductive layer 53 is provided. The state after termination of etching is shown in FIG. 63. In this case, when a thickness of the second surface-side conductive material 79 is reduced to 5 µm, the etching is terminated. As a result, a second conductive layer 94 including the second surface-side conductive material 79, the second intermediate conductive material 78, the second bottom-side conductive material 76, and the second surface conductive layer 53 is formed. The second conductive layer 94 is composed of three layers, i.e., the second surface conductive layer 53, the second intermediate conductive material 78, and the second surface-side conductive material 79 in a region where the second surface conductive layer 53 is provided, whereas the second conductive layer 94 is composed of three layers, i.e., the second bottom-side conductive material 76, the second intermediate conductive material 78, and the second surface-side conductive material 79, which is situated above the second base film 51, in a region where the second surface conductive layer 53 is not provided.

Figure 64A:
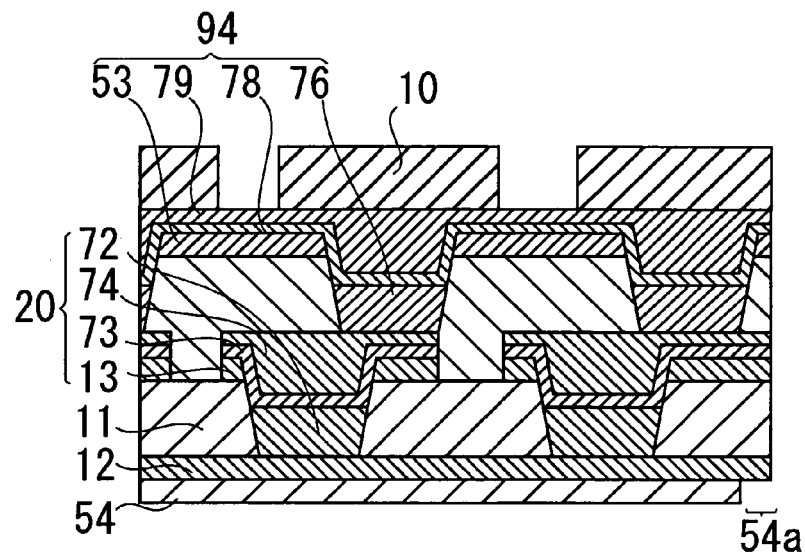
FIG. 64A is a thirty-first cross section for illustrating the method of manufacturing the flexible wiring board according to the further embodiment of the present invention, and FIG.

Thereafter, as shown in FIG. 64A, after a resist is applied onto a surface of the second conductive layer 94, the resist is patterned into a desired pattern to form a resist film 10.

Figure 64B:
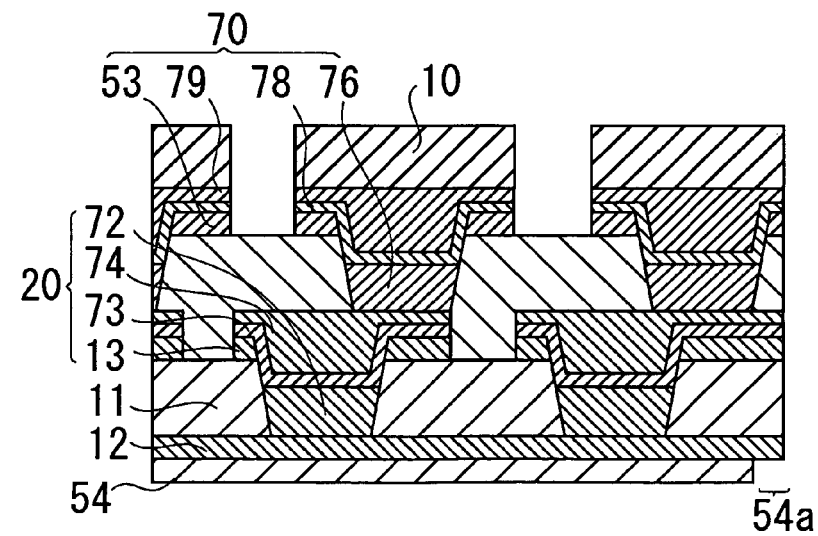

Next, as shown in FIG. 64B, the second conductive layer 94 is patterned into a desired pattern, using the resist film 10 as a mask. As a result, a second wiring layer 70 is formed. The second wiring layer 70 is composed of three layers, i.e., the second bottom-side conductive material 76, the second intermediate conductive material 78, and the second surface-side conductive material 79 in a region where the second via hole 55 is formed, whereas the second wiring layer 70 is composed of three layers, i.e., the second surface conductive layer 53, the second intermediate conductive material 78, and the second surface-side conductive material 79 in a region of the second base film 51 where the second via hole 55 is not formed.

At this time, three layers, i.e., the second surface conductive layer 53, the second intermediate conductive material 78, and the second surface-side conductive material 79, are etched away. Since the first surface-side conductive material 79 is thinned by etching and the total thickness of these three layers is thus also reduced, a pattern of the thus formed wiring layer 70 is substantially identical with that of the resist film 10 as shown in FIG. 64B even if isotropic etching such as wet etching is conducted.

Subsequently, after the carrier film 54 is stripped off, the reference conductive layer 12 is patterned into a desired pattern to form a reference wiring layer 21. This state is shown in FIG. 65. Through the steps described above, a double-layered flexible wiring board 5 is completed.

In the above-described manufacturing method, since the first and second conductive layers 92 and 94, each having a small thickness, are patterned by etching to respectively form the first and second wiring layers 20 and 70, a pattern width of each of the first and second layers 20 and 70 is not reduced, contrary to a conventional case where a pattern width becomes smaller than a desired width by etching a thick conductive layer. As a result, a desired pattern width can be obtained.

In the flexible wiring board 5 as described above, the first and second via holes 15 and 55 are respectively filled with three layers, that is, the first and second bottom-side conductive materials 72 and 76, the first and second intermediate conductive materials 73 and 78, and the first and second surface-side conductive materials 74 and 79, respectively. As described above, since each of the via holes 15 and 55 is filled without generating any void, connection failure due to such a void is not caused.

Although the reference conductive layers, the coating conductive layers and the electroless plating layers are all made of copper in the above-described embodiments, the present invention is not limited thereto. These layers may be made of any conductive material as long as it has a good conductivity.

Moreover, although the first and second conductive materials 16 and 56 are both made of copper, the present invention is not limited thereto. These materials may be made of any conductive material as long as it has a good conductivity.

Furthermore, although the first and second bottom-side conductive materials 72 and 76 and the first and second surface-side conductive materials 74 and 79 are all made of copper, the present invention is not limited thereto. Any material may be used as long as it has a good conductivity and can be grown by electrolytic plating. Similarly, a material of the first and second intermediate conductive materials is not limited to copper. Any material may be used as long as it has a good conductivity and can be grown by electroless plating.

Furthermore, although the first and second coating conductive layers 91 and 93 are thinned by wet etching, the present invention is not limited thereto. The first and second coating conductive layers 91 and 93 may be thinned by, for example, dry etching, or by physically polishing these layers.

As described above, a flexible wiring board according to the present invention is useful as a wiring board for various types of electric equipment.

What is claimed is:

1. A method of manufacturing a flexible wiring board, with a substrate, wherein the wiring board comprises a reference conductive layer; a first base film provided on said reference conductive layer; and a first surface conductive layer provided on said first base film, the method comprising:

forming a first hole penetrating said first surface conductive layer and said first base film so that said reference conductive layer is exposed on its bottom and said first base film is exposed on an inner peripheral side face;

depositing, by electroless plating, a first electroless plating layer on at least a surface of said first base film exposed on the inner peripheral side face of said first hole;

growing, by electrolytic plating, a first electrolytic plating layer on a surface of said first electroless plating layer so as to fill said first hole with said first electrolytic plating layer and then providing said electroless plating layer and said electrolytic plating layer on said first surface conductive layer to form a first surface coating layer;

etching said first electrolytic plating layer so as to reduce a thickness of said first surface coating layer on said first base film; and forming a patterned resist film on a surface of said first surface coating layer having a reduced thickness and then removing said first surface coating layer situated on a bottom of an opening of said resist film so as to pattern said first surface coating layer.

2. The method of manufacturing a flexible wiring board according to claim 1, wherein said first surface conductive layer is a metal foil and is adhered to said first base film.

3. The method of manufacturing a flexible wiring board according to claim 1, wherein said reference conductive layer is brought into contact with an electrode when said electrolytic plating is conducted.

4. The method of manufacturing a flexible wiring board according to claim 1, further comprising the step of depositing an auxiliary electrolytic plating layer by electrolytic plating on a surface of said reference conductive layer, exposed on the bottom of said first hole, prior to said step of depositing the first electroless plating layer.

5. The method of manufacturing a flexible wiring board according to claim 4, wherein growth of said auxiliary electrolytic plating layer is terminated before said auxiliary electrolytic plating layer reaches said first surface conductive layer.

6. The method of manufacturing a flexible wiring board according to claim 1, further comprising the steps of:

providing a second base film and a second surface conductive layer on said patterned first surface coating layer;

forming a second hole penetrating said second surface conductive layer and said second base film so that said first surface coating layer is exposed on its bottom and said second base film is exposed on its inner peripheral side face;

depositing, by electroless plating, a second electroless plating layer on at least a surface of said second base film exposed on inner peripheral side face of said second hole; and growing, by electrolytic plating, a second electrolytic plating layer on a surface of said second electroless plating layer so as to fill said second hole with said second electrolytic plating layer.

7. The method of manufacturing a flexible wiring board according to claim 6, wherein said second surface conductive layer is a metal foil and adhered to said second base film.

8. The method of manufacturing a flexible wiring board according to claim 6, further comprising the step of patterning said second surface conductive layer.

9. The method of manufacturing a flexible wiring board according to claim 6, further comprising the steps of:

providing a third base film and a third surface conductive layer on the surface of said reference conductive layer opposite to the side where said first base film is provided;

forming a third hole penetrating said third surface conductive layer and said third base film so that said reference conductive layer is exposed on its bottom and said third base film is exposed on an inner peripheral side face;

depositing, by electroless plating, a third electroless plating layer on at least a surface of said third base film exposed on the inner peripheral side face of said third hole;

growing, by electrolytic plating, a third electrolytic plating layer on a surface of said third electroless plating layer so as to fill said third hole with said third electrolytic plating layer; and removing said third electrolytic plating layer and said third electroless plating layer provided on said third surface conductive layer so as to expose said third surface conductive layer.

10. The method of manufacturing a flexible wiring board according to claim 9, further comprising the step of patterning said third surface conductive layer.

* * * * *